United States Patent
Alrod et al.

(10) Patent No.: US 10,262,743 B2
(45) Date of Patent: Apr. 16, 2019

(54) COMMAND SEQUENCE FOR FIRST READ SOLUTION FOR MEMORY

(71) Applicant: SanDisk Technologies LLC, Plano, TX (US)

(72) Inventors: Idan Alrod, Herzliya (IL); Eran Sharon, Rishon Lezion (IL); Alon Eyal, Zichron Yaacov (IL); Liang Pang, Fremont, CA (US); Evgeny Mekhanik, Rehovot (IL)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/440,185

(22) Filed: Feb. 23, 2017

(65) Prior Publication Data

US 2018/0114580 A1    Apr. 26, 2018

Related U.S. Application Data

(63) Continuation-in-part of application No. 15/333,440, filed on Oct. 25, 2016.

(51) Int. Cl.
*G11C 7/00* (2006.01)
*G11C 16/26* (2006.01)
(Continued)

(52) U.S. Cl.
CPC .............. *G11C 16/26* (2013.01); *G11C 16/08* (2013.01); *G11C 16/349* (2013.01);
(Continued)

(58) Field of Classification Search
CPC . G06F 11/1068; G11C 16/0483; G11C 16/10; G11C 16/3418; G11C 16/26
(Continued)

(56) References Cited

U.S. PATENT DOCUMENTS 5,168,463 A    12/1992   Ikeda et al.
5,491,809 A    2/1996    Coffman et al.
(Continued)

OTHER PUBLICATIONS

Notice of Allowance dated Mar. 10, 2017, U.S. Appl. No. 15/191,898, filed Jun. 24, 2016.
(Continued)

*Primary Examiner* — Xiaochun L Chen
(74) *Attorney, Agent, or Firm* — Vierra Magen Marcus LLP

(57) ABSTRACT

Techniques are provided for improving the accuracy of read operations of memory cells, where the threshold voltage of a memory cell can shift depending on when the read operation occurs. A command is issued for performing a conditioning operation which helps to transition the memory cells so that their threshold voltages are at predictable levels. In one approach, the conditioning operation is performed by applying a voltage pulse to one or more word lines in response to a trigger, such as detecting that a duration since a last sensing operation exceeds a threshold, detecting that a duration since a last performance of the conditioning operation exceeds a threshold, or a detecting that a read command has been issued. Moreover, the peak power consumption required to perform the conditioning operation can be reduced for various configurations of a memory device on one or more die.

20 Claims, 31 Drawing Sheets

(51) Int. Cl.
*G11C 16/34* (2006.01)
*G11C 16/08* (2006.01)
*G11C 16/04* (2006.01)

(52) U.S. Cl.
CPC ...... *G11C 16/3418* (2013.01); *G11C 16/0483* (2013.01); *G11C 2211/563* (2013.01)

(58) Field of Classification Search
USPC .................................................. 365/185.03
See application file for complete search history.

(56) References Cited

U.S. PATENT DOCUMENTS

| | | | |
|---|---|---|---|
| 5,555,527 A | 9/1996 | Kotani et al. | |
| 6,343,033 B1* | 1/2002 | Parker ................ | G11C 11/5621 365/185.03 |
| 6,751,146 B1* | 6/2004 | Wang ................... | G11C 11/406 365/222 |
| 7,161,837 B2 | 1/2007 | Park | |
| 7,180,786 B2 | 2/2007 | Mastrangelo et al. | |
| 7,778,083 B2* | 8/2010 | Moon ................... | G11C 16/10 365/185.18 |
| 7,821,832 B2 | 10/2010 | Hahn | |
| 8,085,616 B2 | 12/2011 | Ryu | |
| 8,406,053 B1* | 3/2013 | Dutta ................... | G11C 11/5642 365/185.03 |
| 8,576,624 B2* | 11/2013 | Dutta ................... | G11C 11/5642 365/185.03 |
| 9,082,486 B2 | 7/2015 | Yang | |
| 9,123,389 B1* | 9/2015 | Park ..................... | G11C 11/406 |
| 9,275,737 B2 | 3/2016 | Maejima | |
| 9,378,830 B2* | 6/2016 | Khoueir ............... | G11C 16/10 |
| 9,418,743 B1 | 8/2016 | Chen | |
| 10,061,647 B2 | 8/2018 | Shim et al. | |
| 2003/0085731 A1 | 5/2003 | Iwase et al. | |
| 2005/0195304 A1 | 9/2005 | Nitta et al. | |
| 2007/0183242 A1 | 8/2007 | Miyamoto | |
| 2009/0052255 A1* | 2/2009 | Moon ................... | G11C 16/10 365/185.19 |
| 2010/0027314 A1* | 2/2010 | Chevallier ........... | G11C 5/02 365/148 |
| 2010/0074026 A1 | 3/2010 | Kang | |
| 2011/0032746 A1 | 2/2011 | Maejima et al. | |
| 2011/0305089 A1 | 12/2011 | Abe et al. | |
| 2012/0221913 A1 | 8/2012 | Anholt et al. | |
| 2012/0257453 A1 | 10/2012 | Shiino et al. | |
| 2013/0070524 A1* | 3/2013 | Dutta ................... | G11C 11/5642 365/185.03 |
| 2013/0148425 A1* | 6/2013 | Dutta ................... | G11C 11/5642 365/185.03 |
| 2013/0235649 A1* | 9/2013 | Lindstadt ............. | G11C 13/0035 365/148 |
| 2014/0098593 A1 | 4/2014 | Calderoni et al. | |
| 2014/0140148 A1 | 5/2014 | An | |
| 2014/0346320 A1 | 11/2014 | Sohn | |
| 2014/0355340 A1 | 12/2014 | Sharon et al. | |
| 2015/0023097 A1* | 1/2015 | Khoueir ............... | G11C 16/10 365/185.03 |
| 2015/0092488 A1* | 4/2015 | Wakchaure .......... | G11C 16/349 365/185.03 |
| 2016/0098216 A1 | 4/2016 | Huang et al. | |
| 2016/0141301 A1 | 5/2016 | Mokhlesi et al. | |
| 2016/0203873 A1 | 7/2016 | Kuribara et al. | |
| 2017/0236595 A1* | 8/2017 | Maejima ............. | G11C 16/0483 365/185.12 |

OTHER PUBLICATIONS

Response to Office Action dated Jan. 30, 2017, U.S. Appl. No. 15/191,898, filed Jun. 24, 2016.
U.S. Appl. No. 15/451,186, filed Mar. 6, 2017.
Restriction Requirement dated Jun. 15, 2017, U.S. Appl. No. 15/333,440, filed Oct. 25, 2016.
U.S. Appl. No. 15/191,898, filed Jun. 24, 2016, entitled "System Solution for First Read Issue Using Time Dependent Read Voltages," by Yip et al.
U.S. Appl. No. 15/131,392, filed Apr. 18, 2016, entitled "Dummy Voltage to Reduce First Read Effect in Memory," by Pang et al.
Restriction Requirement dated Oct. 18, 2017, U.S. Appl. No. 15/451,186, filed Mar. 6, 2017.
Response to Restriction Requirement dated Nov. 8, 2017, U.S. Appl. No. 15/451,186, filed Mar. 6, 2017.
Response to Office Action dated Oct. 20, 2017, U.S. Appl. No. 15/333,440, filed Oct. 25, 2016.
Non-final Office Action dated Nov. 16, 2017, U.S. Appl. No. 15/451,186, filed Mar. 6, 2017.
U.S. Appl. No. 15/816,546, filed Nov. 17, 2017 by Dutta et al.
Non-Final Office Action dated Nov. 2, 2016, U.S. Appl. No. 15/191,898, filed Jun. 24, 2016 by Yip et al.
Response to Restriction Requirement dated Jul. 17, 2017, U.S. Appl. No. 15/333,440, filed Oct. 25, 2016.
Non-final Office Action dated Aug. 9, 2017, U.S. Appl. No. 15/333,440, filed Oct. 25, 2016.
International Search Report & The Written Opinion of the International Searching Authority dated Dec. 11, 2017.
Non-final Office Action dated Jan. 2, 2018, U.S. Appl. No. 15/816,546, filed Nov. 17, 2017.
Notice of Allowance dated Dec. 11, 2017, U.S. Appl. No. 15/333,440, filed Oct. 25, 2016.
Response to Office Action dated Feb. 12, 2018, U.S. Appl. No. 15/451,186, filed Mar. 6, 2017.
U.S. Appl. No. 15/921,165, filed Mar. 14, 2018, by Alrod et al.
U.S. Appl. No. 15/921,184, filed Mar. 14, 2018, by Alrod et al.
Response to Office Action dated Apr. 5, 2018, U.S. Appl. No. 15/816,546, filed Nov. 17, 2017.

* cited by examiner

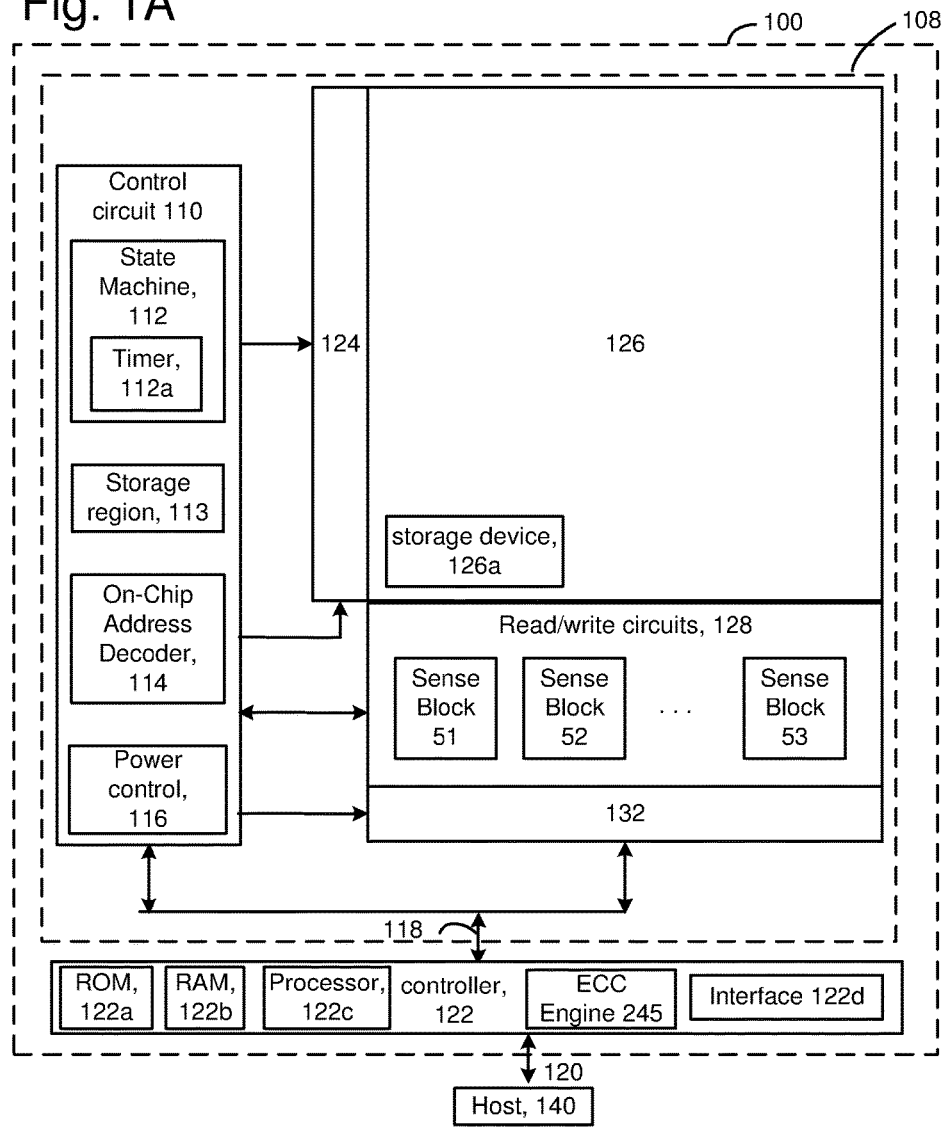
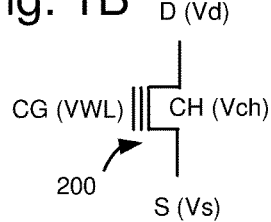

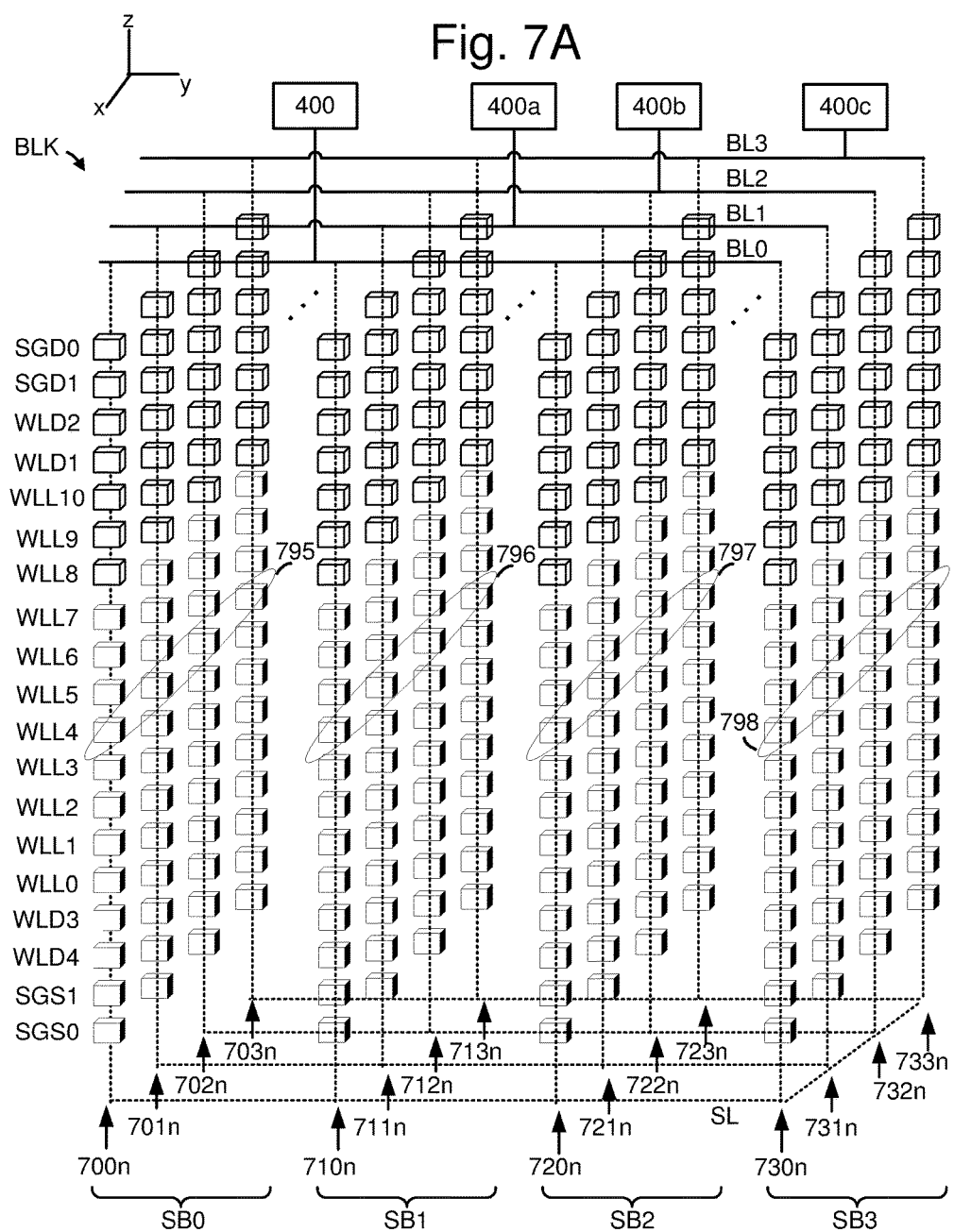

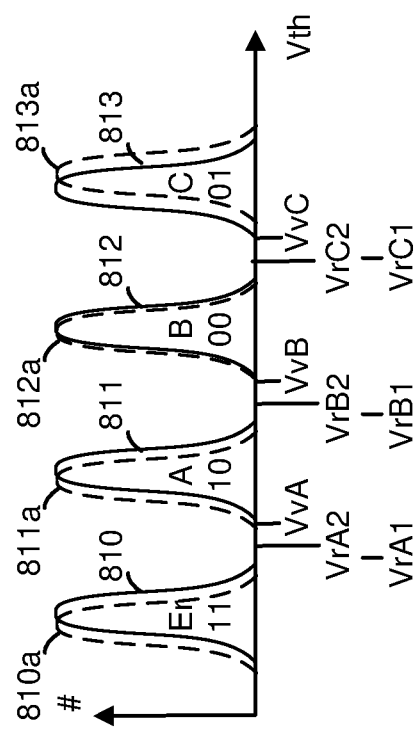

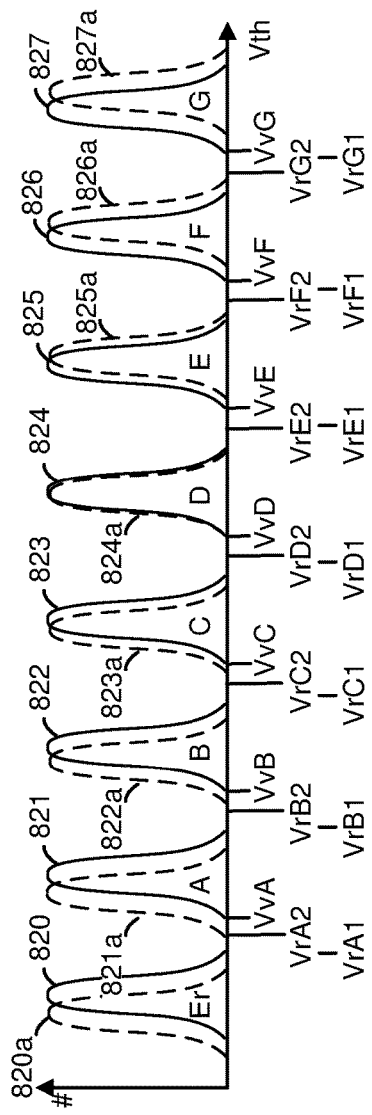

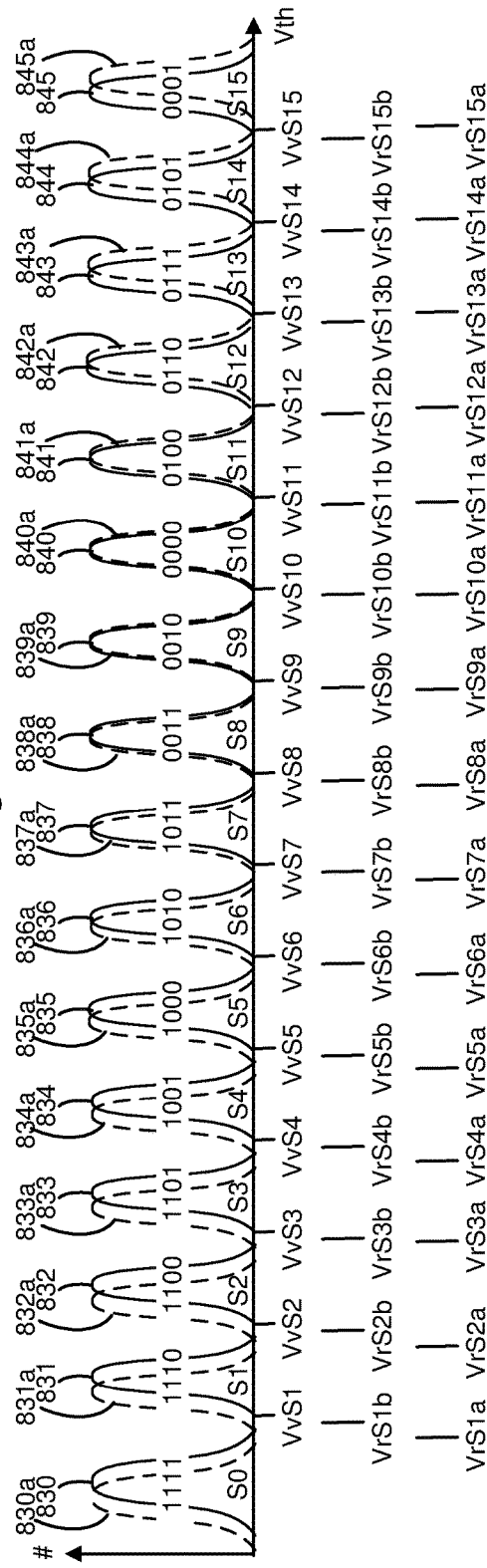

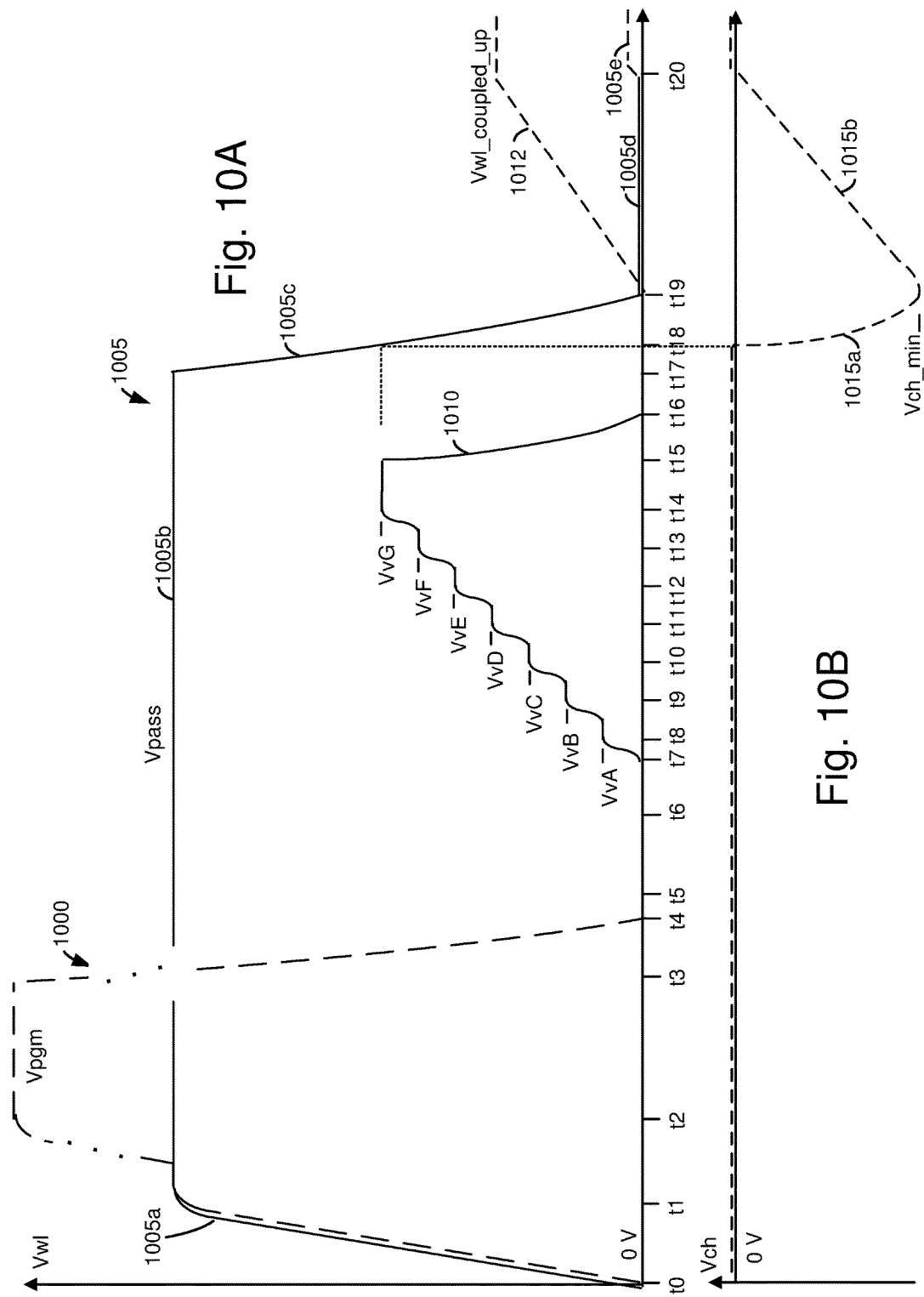

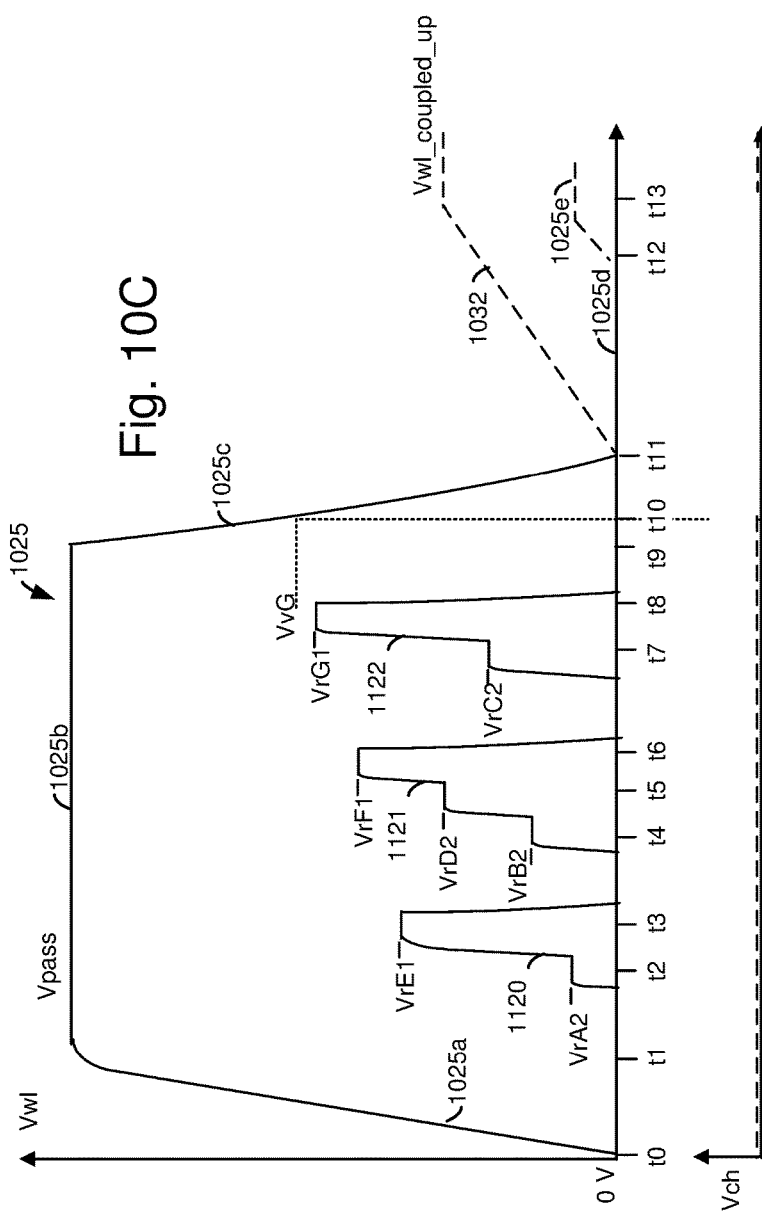

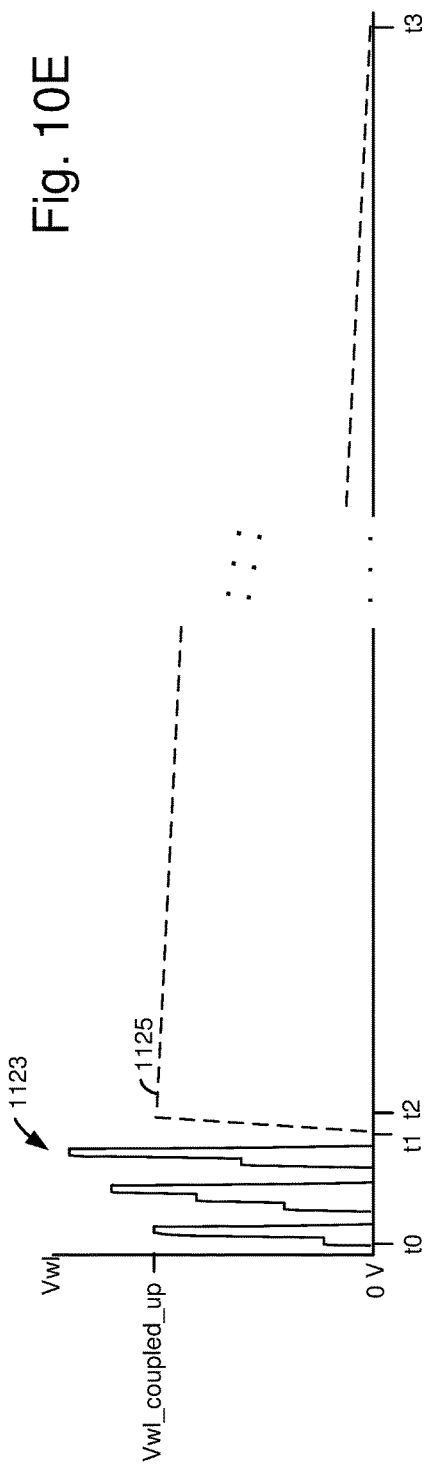
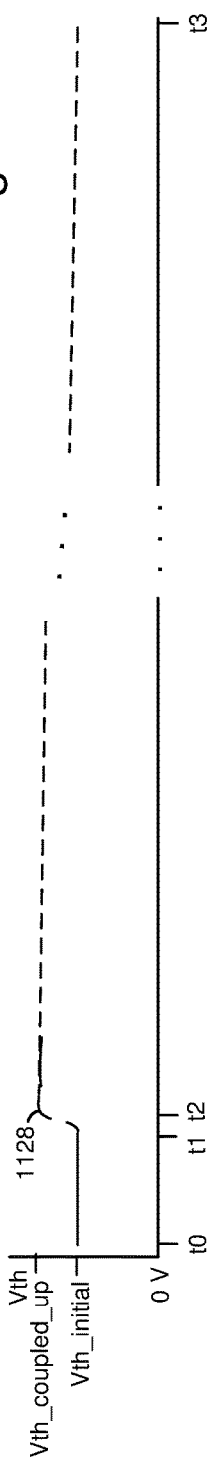

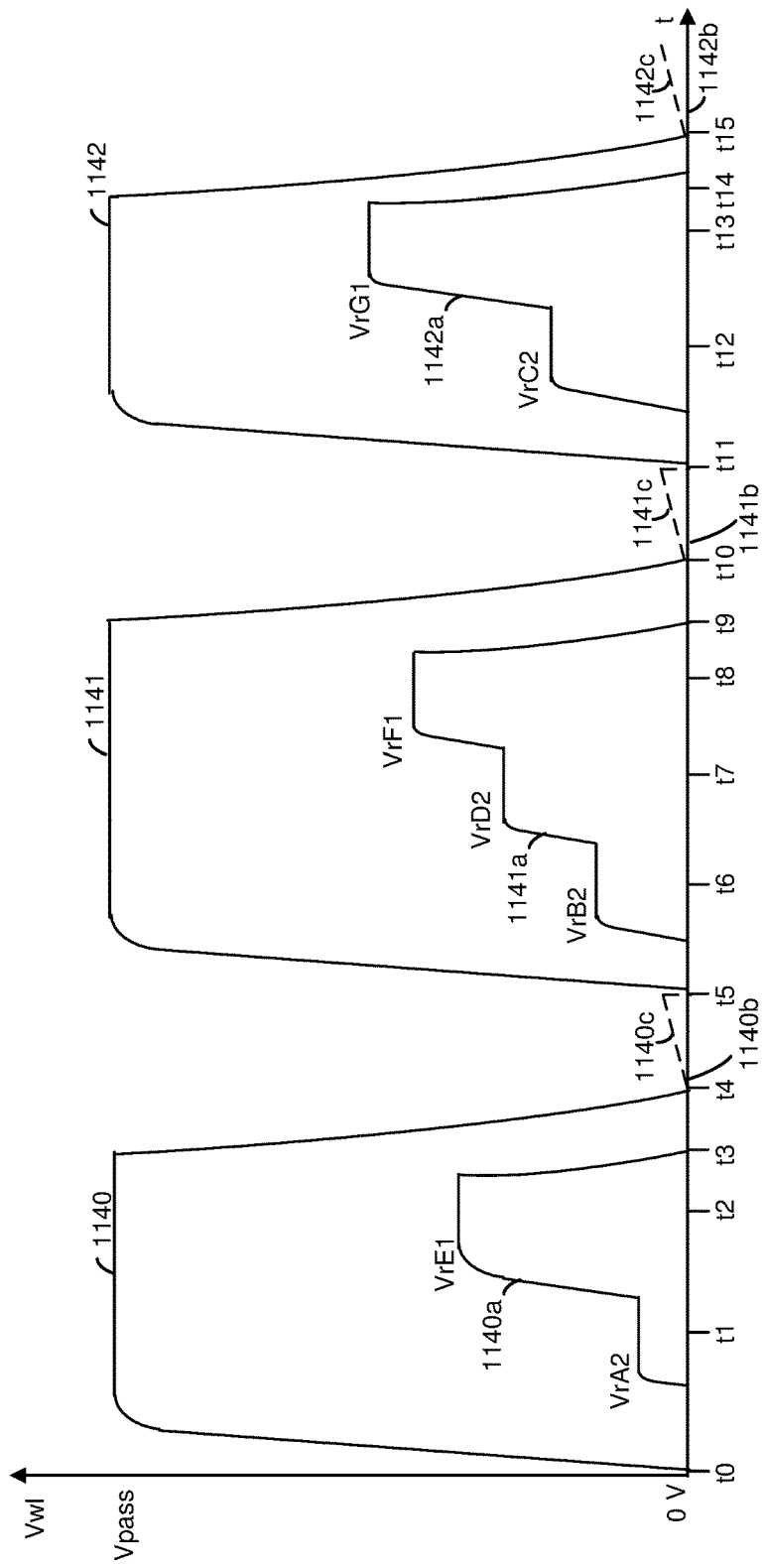

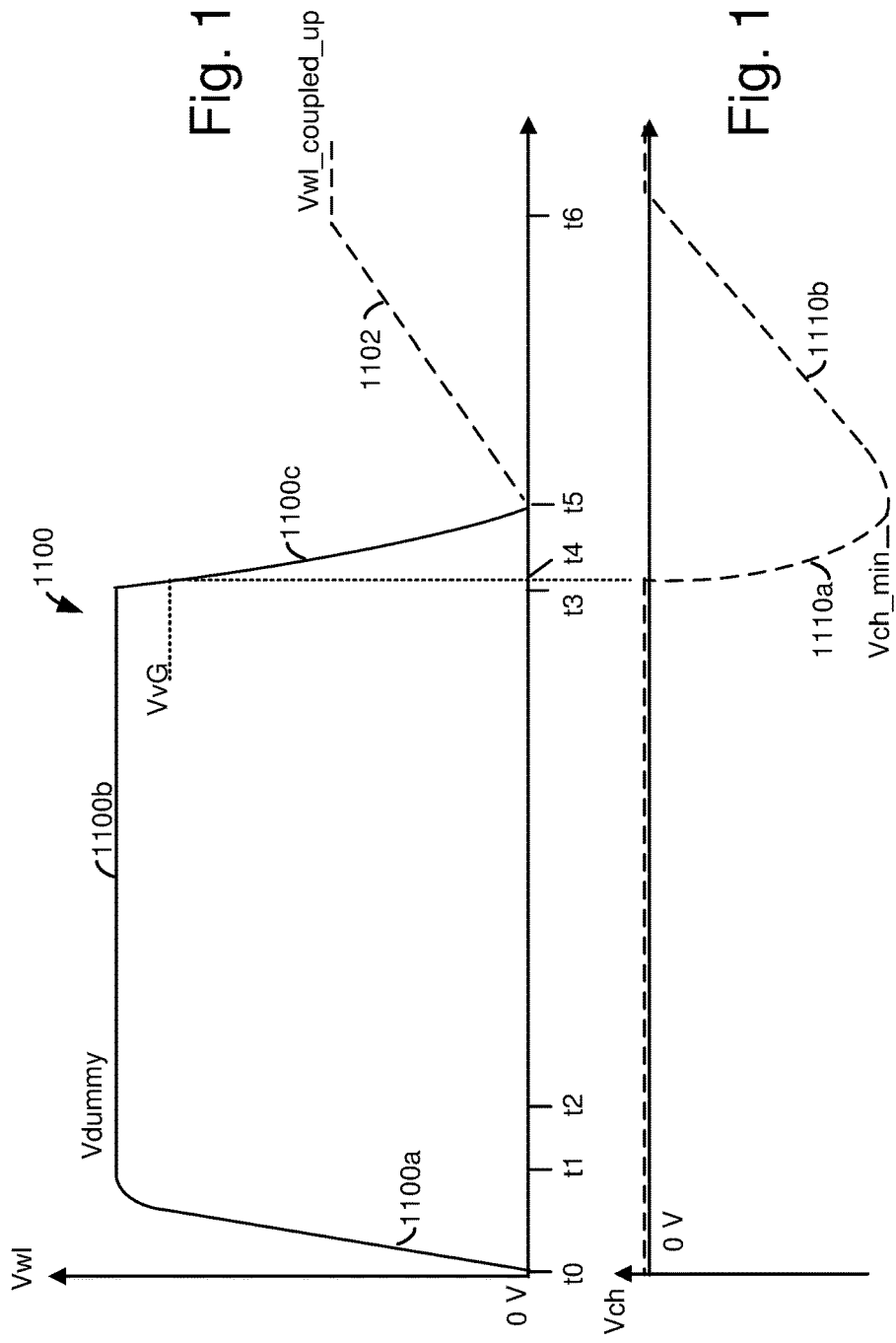

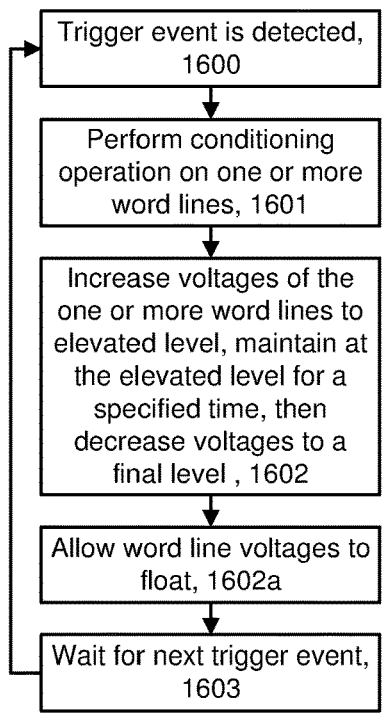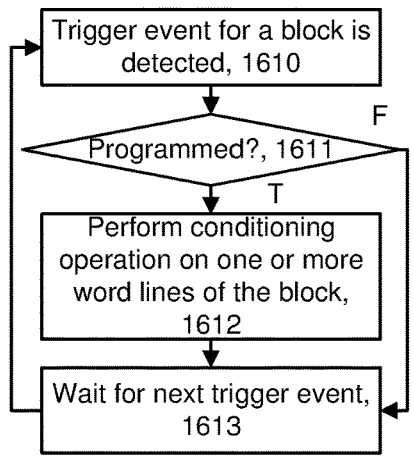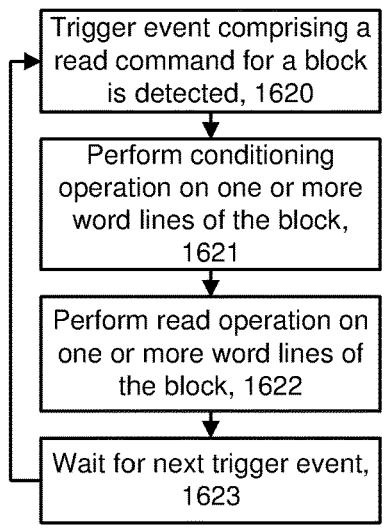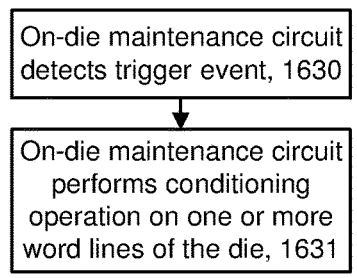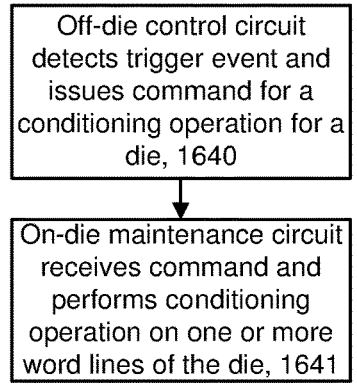
Fig. 16A
Fig. 16B
Fig. 16C
Fig. 16D
Fig. 16E

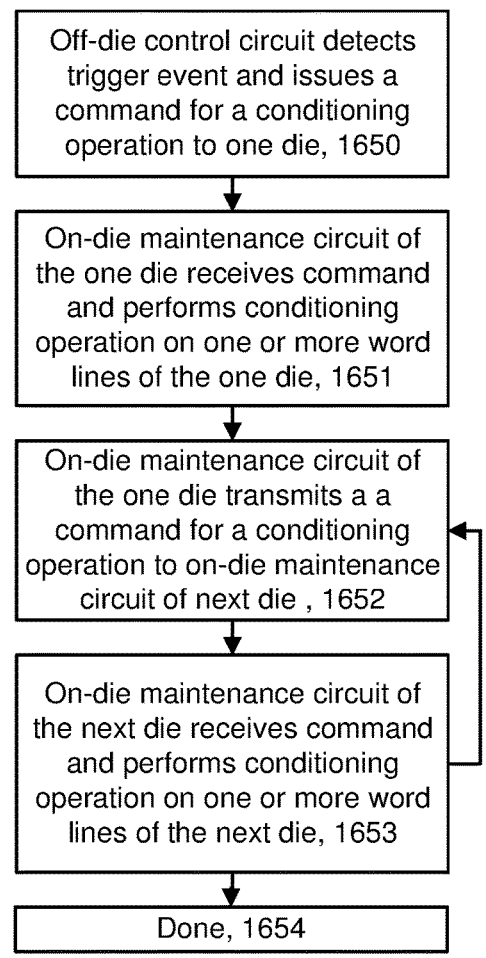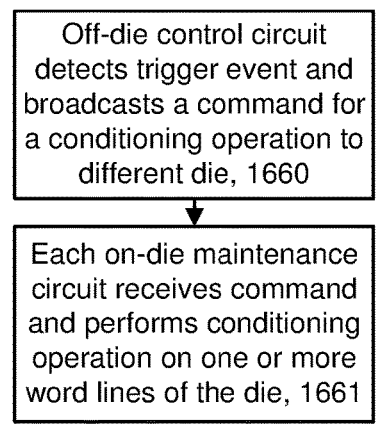
Fig. 16F
Fig. 16G

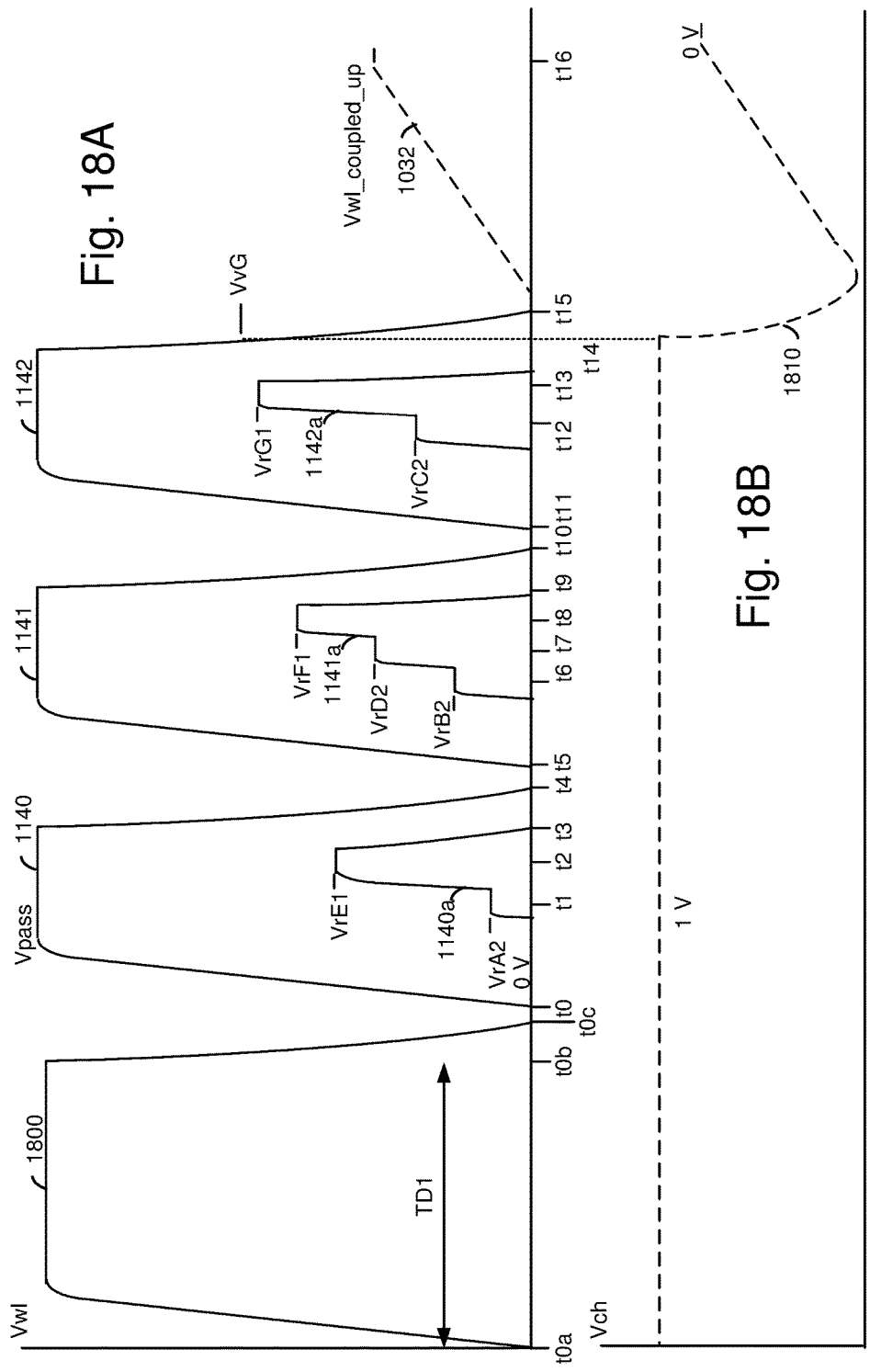

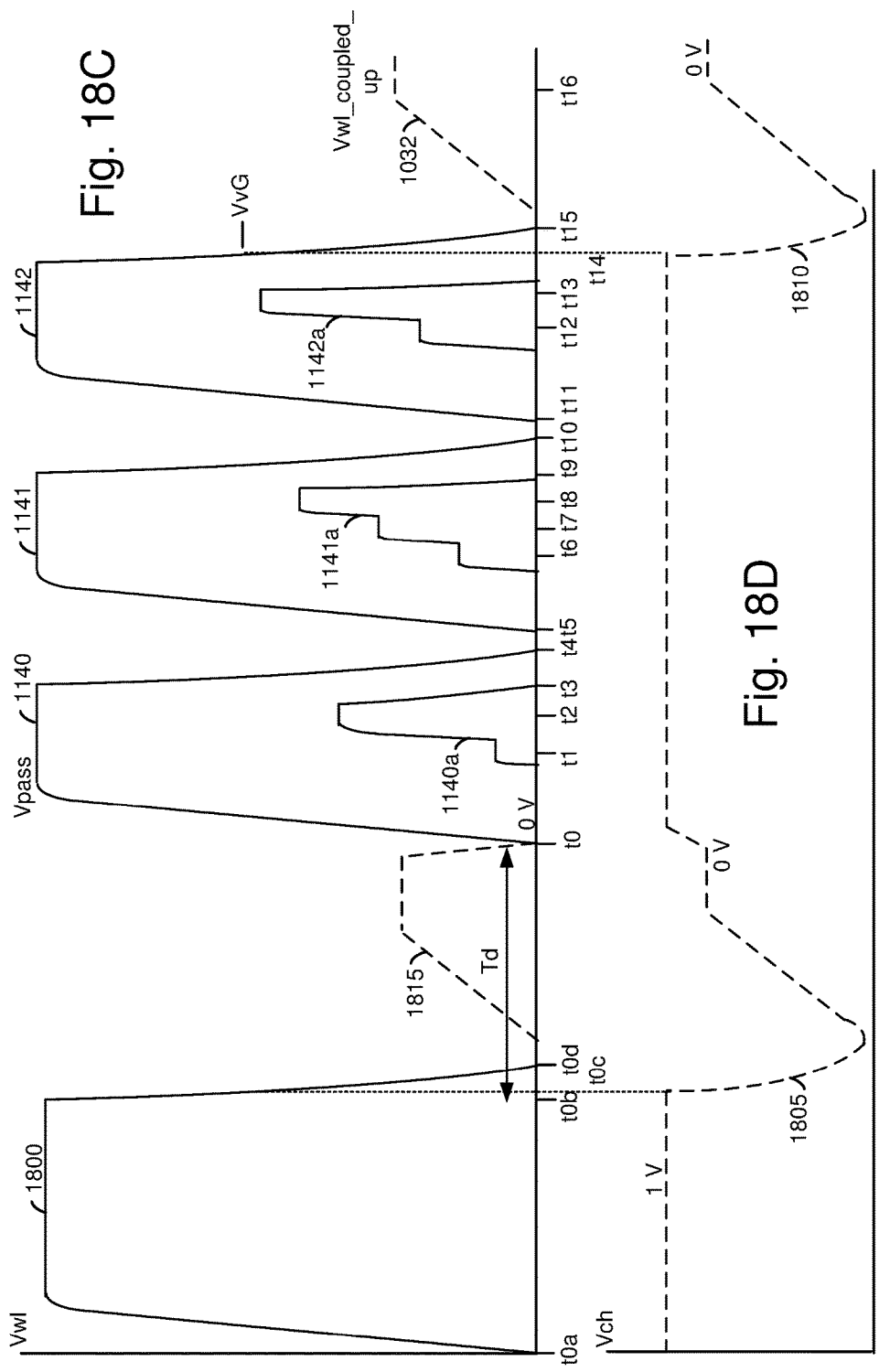

COMMAND SEQUENCE FOR FIRST READ SOLUTION FOR MEMORY

CROSS-REFERENCE TO RELATED APPLICATIONS

This application is a continuation-in-part of U.S. patent application Ser. No. 15/333,440, filed Oct. 25, 2016, published as US2018/0113759 on Apr. 26, 2018 and issued as U.S. Pat. No. 9,952,944 on Apr. 24, 2018, and incorporated herein by reference.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 1A is a block diagram of an example memory device.

FIG. 1B depicts an example memory cell 200.

FIG. 7A depicts an example view of NAND strings in sub-blocks in a 3D configuration which is consistent with FIG. 4.

FIG. 8A depicts an example Vth distribution of memory cells, where four data states are used, in a first read situation compared to a second read situation.

FIG. 8B depicts example bit sequences for lower and upper pages of data, and associated read voltages, for the Vth distributions of FIG. 8A.

FIG. 8C depicts an example Vth distribution of memory cells, where eight data states are used, in a first read situation compared to a second read situation.

FIG. 8D depicts example bit sequences for lower, middle and upper pages of data, and associated read voltages, for the Vth distributions of FIG. 8C.

FIG. 8E depicts an example Vth distribution of memory cells, where sixteen data states are used, in a first read situation compared to a second read situation.

FIG. 8F depicts example bit sequences for lower, lower middle, upper middle and upper pages of data, and associated read voltages, for the Vth distributions of FIG. 8E.

FIG. 10A depicts a plot of example waveforms in a programming operation.

FIG. 10B depicts a plot of a channel voltage (Vch) corresponding to FIG. 10A.

FIG. 10C depicts a plot of example waveforms in a read operation, where Vpass is applied continuously with read voltages of different pages.

FIG. 10D depicts a plot of a channel voltage (Vch) corresponding to FIG. 10C.

FIG. 10E depicts the waveforms of FIG. 10C showing a decay of the coupled up voltage of the word line.

FIG. 10F depicts a plot of a channel voltage consistent with FIG. 10E.

FIG. 10G depicts a plot of a Vth of a memory cell connected to the coupled up word line, consistent with FIGS. 10E and 10F.

FIG. 10H depicts a plot of example waveforms in a read operation, where Vpass is applied separately during read voltages of different pages.

FIG. 11A depicts a plot of an example dummy voltage of a word line and a subsequent coupled up voltage of the word line.

FIG. 11B depicts a plot of a channel voltage which is coupled down from a starting level and subsequently returns to the starting level, consistent with FIG. 11A.

FIG. 16A depicts an example process for performing a conditioning operation for one or more word lines.

FIG. 16B depicts an example process for performing a conditioning operation for one or more word lines of a block, where a check is performed to determine if the block is programmed before performing the conditioning operation.

FIG. 16C depicts an example process for performing a conditioning operation for one or more word lines of a block in response to a read command, where the conditioning operation is performed before the read operation.

FIG. 16D depicts an example process for performing a conditioning operation for a die, where an on-die maintenance circuit determines that a trigger event is met.

FIG. 16E depicts an example process for performing a conditioning operation for a die, where an off-die control circuit determines that a trigger event is met.

FIG. 16F depicts an example process for performing a conditioning operation for multiple die, one die at a time.

FIG. 16G depicts an example process for performing a conditioning operation for multiple die concurrently.

FIG. 18A depicts a plot of example waveforms in a read operation similar to FIG. 10H, where a voltage pulse of a conditioning operation is applied before the read operation, consistent with the process of FIG. 16C.

FIG. 18B depicts a plot 1810 of a channel voltage (Vch) corresponding to FIG. 18A.

FIG. 18C depicts a plot of example waveforms in a read operation similar to FIG. 10H, where a voltage pulse of a conditioning operation is applied before the read operation, and before a delay period, consistent with the process of FIG. 16C.

FIG. 18D depicts a plot of a channel voltage (Vch) corresponding to FIG. 18C.

DETAILED DESCRIPTION

Techniques are provided for improving the accuracy of read operations in a memory device. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

Figure 9:
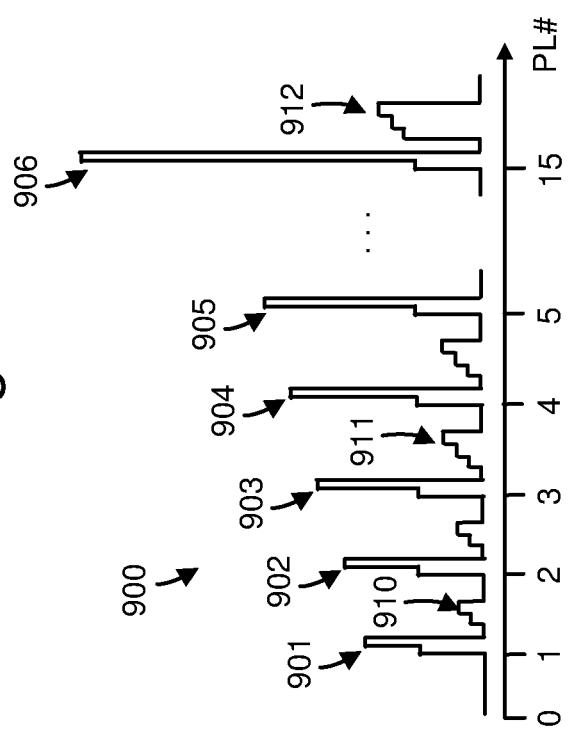
FIG. 9 depicts a waveform of an example programming operation.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 8A). In a three-bit per cell memory device, there are eight data states including the erased state and seven higher data states referred to as the A, B, C, D, E, F and G data states (see FIG. 8C). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states (see FIG. 8E) where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, it has been observed that the Vth of a memory cell can vary depending on when the read operation occurs. For example, the Vth can vary in the memory cells depending on a coupled up state of the word lines when the read operation occurs. A "first read" situation can be defined in which the word lines are not coupled up, and a "second read" situation can be defined in which the word lines are coupled up.

The memory cells can be in the first read situation after a power on event in the memory device. When the memory device is powered up for use, an operation may occur which checks for bad blocks. This operation involves applying 0 V or other low voltage to the word lines. As a result, any coupling up of the word line voltages is discharged.

The word lines can also be discharged in a block when the word line voltages are set to a low level. This can occur when the block is inactive while an operation is performed in another block. The cells can also be in the first read situation after a significant amount of time has passed after a last sensing operation, since the word lines discharge over time. The coupling up of the word lines causes a Vth shift in the cells due to inadvertent programming or erasing. Since the word lines are not significantly coupled up while in the first read situation, this Vth does not occur.

The cells can be in the second read situation when the read occurs shortly, e.g., seconds or minutes, after a last sensing operation. Since the word lines are relatively strongly coupled up while in the second read situation, there is a programming or erasing of the cells due to the word line voltage, and a corresponding shift in the Vth. In particular, the word lines with a coupled-up voltage can cause weak programming of cells which have a relatively low Vth, lower than the coupled-up voltage, e.g., cells in lower programmed data states, thus resulting in a Vth upshift for these cells. Also, there can be a weak erasing of cells which have a relatively high Vth, higher than the coupled-up voltage, e.g., cells in higher programmed data states, thus resulting in a Vth downshift for these cells.

The cells gradually transition from the second read situation to the first read situation over time, e.g., one hour, as the word lines are discharged.

The coupling up of the word line voltage is caused by the voltages of a sensing operation such as a verify operation which occurs in connection with a programming operation, or a read operation which occurs after a programming operation is completed. The sensing of the cells involves the application of a sensing voltage (e.g., a read/verify voltage) to a selected word line. At the same time, a read pass voltage is applied to the unselected word lines and then stepped down. This step down temporarily reduces a channel voltage due to capacitive coupling. When the channel voltage increases back to its nominal level, this causes an increase or coupling up of the word line voltages, also due to capacitive coupling. For cells in the lower data states, the Vth gradually decreases as electrons which are trapped in the charge trapping material of the cells are de-trapped and return to the channel. For cells in the higher data states, the Vth gradually increases as electrons are removed from the channel. See FIG. 10A to 13.

When a read operation occurs, it is not known if the cells are in the first or second read situation, or perhaps somewhere in between these two situations. One approach is to track the elapsed time since a power on event or a previous sensing operation. However, this elapsed time may not accurately indicate whether the word lines are coupled up, or the extent of the coupling up, since other factors such as environmental factors and process variations may be relevant. Moreover, separate tracking of each block would be needed.

Techniques provided herein address the above and other issues. In one aspect, a command is issued for performing a conditioning operation for one or more word lines in a block. The conditioning operation helps to transition the memory cells which are connected to the word lines to the second read situation. As a result, a read operation can be performed with reduced read errors using a set of read voltages which is optimized for the second read situation. The conditioning operation helps provide the cells in a condition or state in which a read can occur with reduced read errors, compared to the number of read errors which would occur without the conditioning operation. In one approach, the conditioning operation is performed by increasing voltages of the one or more word lines to an elevated level, followed by a decrease of the voltages of the one or more word lines to a final level, e.g., applying a voltage pulse. Further, a maintenance circuit may perform the conditioning operation on the one or more word lines in response to a trigger, such as detecting that a duration since a last sensing operation exceeds a threshold, detecting that a duration since a last performance of the conditioning operation exceeds a threshold, or a detecting that a read command has been issued.

The voltage waveform can help provide the cells in the second read situation by coupling up of the word lines and/or by soft programming.

Moreover, the peak power consumption required to perform the conditioning operation can be reduced for various configurations of a memory device comprising one or more die.

Various other features and benefits are described below.

FIG. 1A is a block diagram of an example memory device. The memory device 100, such as a non-volatile storage system, may include one or more memory die 108. The memory die 108 includes a memory structure 126 of memory cells, such as an array of memory cells, a control circuit 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller is separate from the memory die, e.g., off the die and is an example of an off-die circuit. Commands and data are transferred between the host 140 and controller 122 via a data bus 120, and between the controller and the one or more memory die 108 via lines 118. The host is also off the die and is another example of an off-die circuit.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuit 110 cooperates with the read/write circuits 128 to perform memory operations on the memory structure 126, and includes a state machine 112, an on-chip address decoder 114, and a power control module 116. The state machine 112 provides chip-level control of memory operations. The state machine may include a timer 112*a* to determine an elapsed time since a last sensing operation or a last conditioning operation, as discussed further below. A storage region 113 may store operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines and bit lines during memory operations. It can include drivers for word lines, SGS and SGD transistors and source lines. See FIG. 21A. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuit 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuit 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example memory cell 200. The memory cell comprises a control gate CG which receives a word line voltage Vwl, a drain at a voltage Vd, a source at a voltage Vs and a channel at a voltage Vch.

Figure 2:
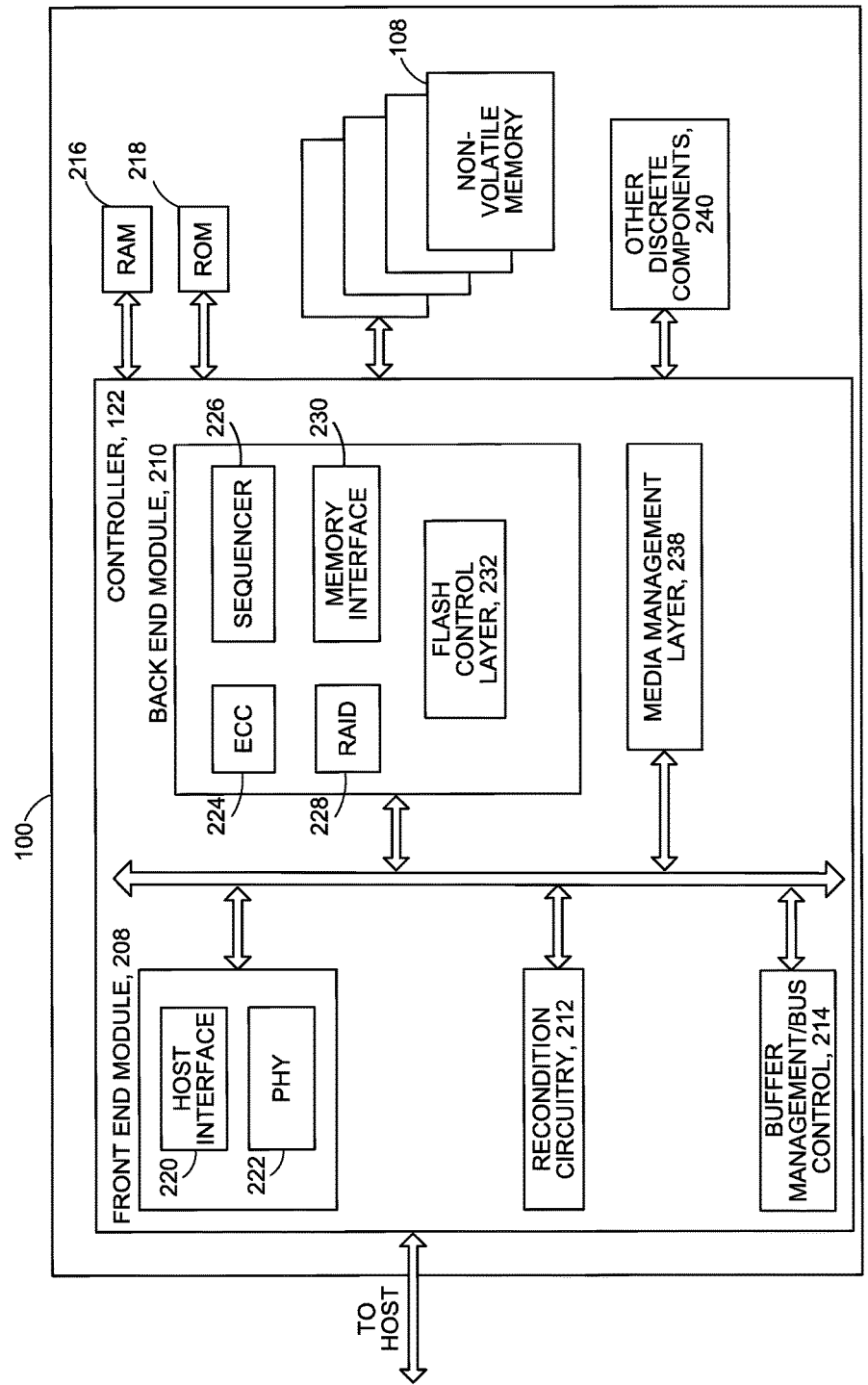
FIG. 2 is a block diagram of the example memory device 100, depicting additional details of the controller 122.

FIG. 2 is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1A (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device 100 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In in one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
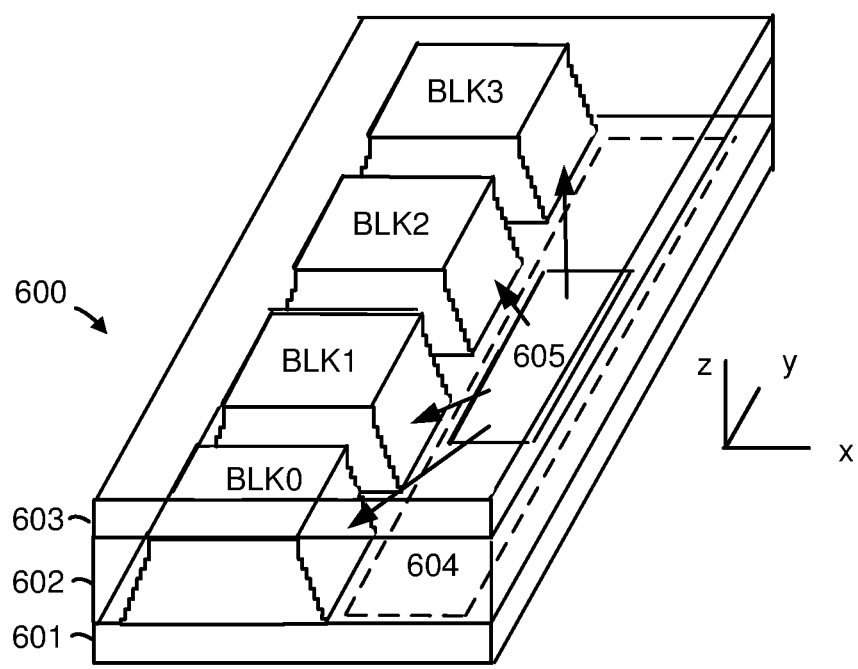
FIG. 3 is a perspective view of a memory device 600 comprising a set of blocks in an example 3D configuration of the memory structure 126 of FIG. 1.

FIG. 3 is a perspective view of a memory device 600 comprising a set of blocks in an example 3D configuration of the memory structure 126 of FIG. 1A. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 4:
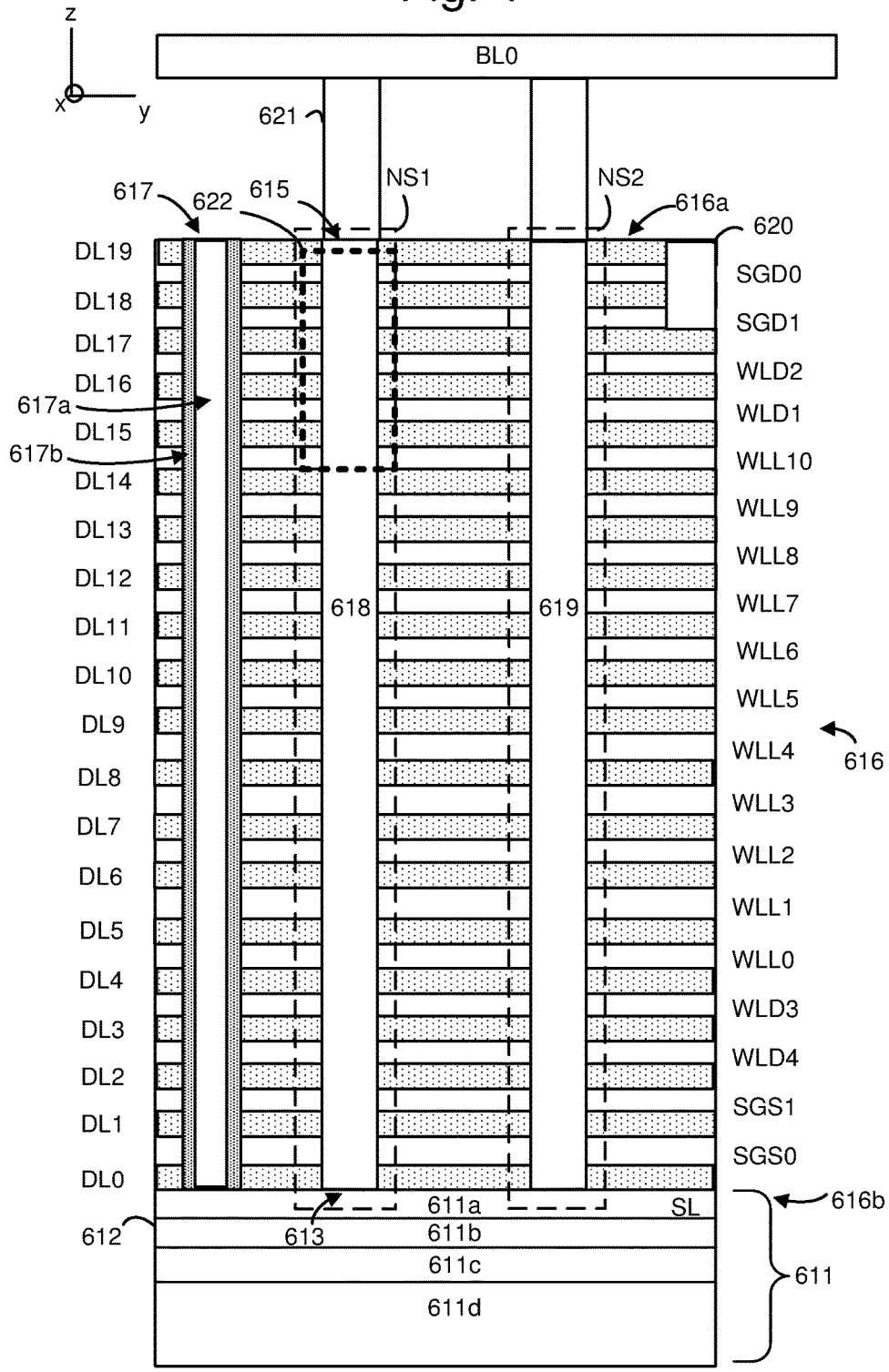
FIG. 4 depicts an example cross-sectional view of a portion of one of the blocks of FIG. 3.

FIG. 4 depicts an example cross-sectional view of a portion of one of the blocks of FIG. 3. The block comprises a stack 616 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack and a drain-end 615 at a top 616a of the stack. Local interconnects, such as local interconnect 617, may be provided periodically across the stack. The local interconnects may be metal-filled slits which extend through the stack, such as to connect the source line/substrate to a line above the stack. The slits may be used during the formation of the word lines and subsequently filled with metal. The local interconnect comprises a conductive region 617a (e.g., metal) within an insulating region 617b. A portion of a bit line BL0 is also depicted. A conductive via 621 connects the drain-end 615 of NS1 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

This example includes two SGD transistors, two drain side dummy memory cells, two source side dummy memory cells and two SGS transistors in each string, as an example. Generally, the use of dummy memory cells is optional and one or more may be provided. Also, one or more SGD transistors and one or more SGS transistors may be provided in a memory string.

Figure 7B:
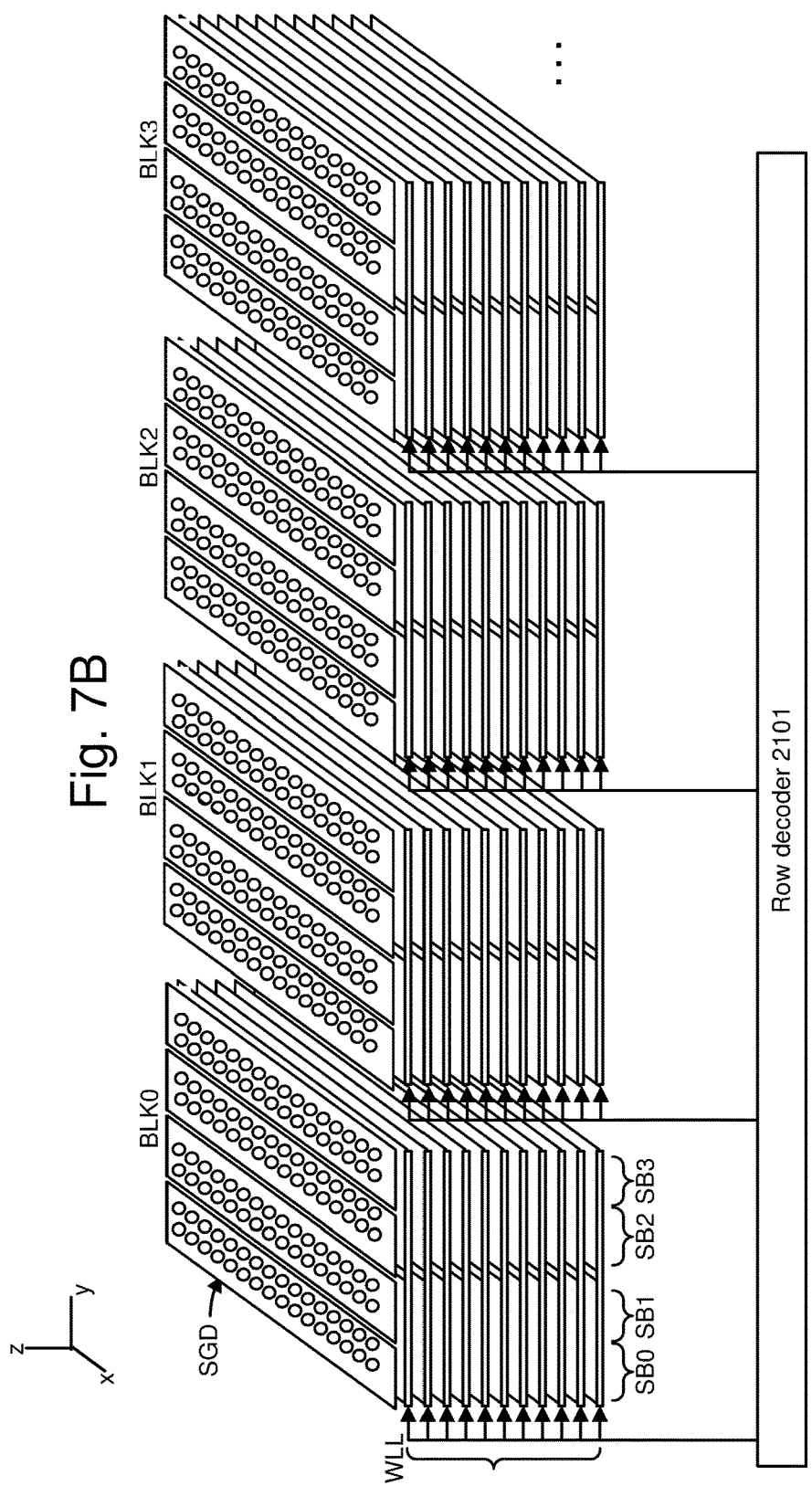
FIG. 7B depicts word line and SGD layers in an example set of blocks which is consistent with FIG. 4.

An insulating region 620 may be provided to separate portions of the SGD layers from one another to provide one independently driven SGD line per sub-block. In this example, the word line layers are common to two adjacent sub-blocks. See also FIG. 7B. In another possible implementation, the insulating region 620 extends down to the substrate to separate the word line layers. In this case, the word line layers are separate in each sub-block. Although, in either case, the word line layers of a block can be joined at their ends to one another so that they are commonly driven within a block, as depicted in FIG. 7B.

Figure 5:
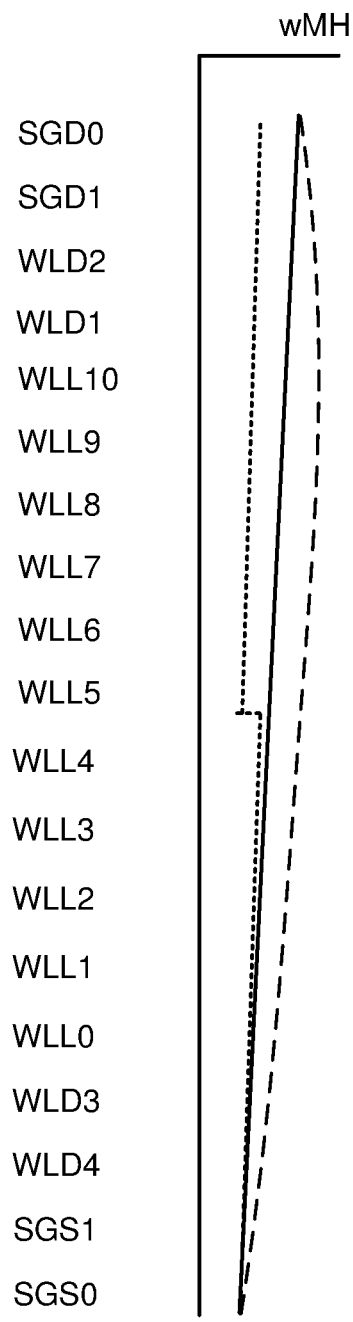
FIG. 5 depicts a plot of memory hole diameter in the stack of FIG. 4.

FIG. 5 depicts a plot of memory hole/pillar diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and resulting pillar, the programming and erase speed of the memory cells can vary based on their position along the memory hole. With a relatively smaller diameter at the bottom of a memory hole, the electric field across the tunnel oxide is relatively stronger, so that the programming and erase speed is higher for memory cells in word lines adjacent to the relatively smaller diameter portion of the memory holes. The amount of word line coupling up and discharge is therefore relatively larger than for memory cells in word lines adjacent to the relatively larger diameter portion of the memory holes.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Figure 6:
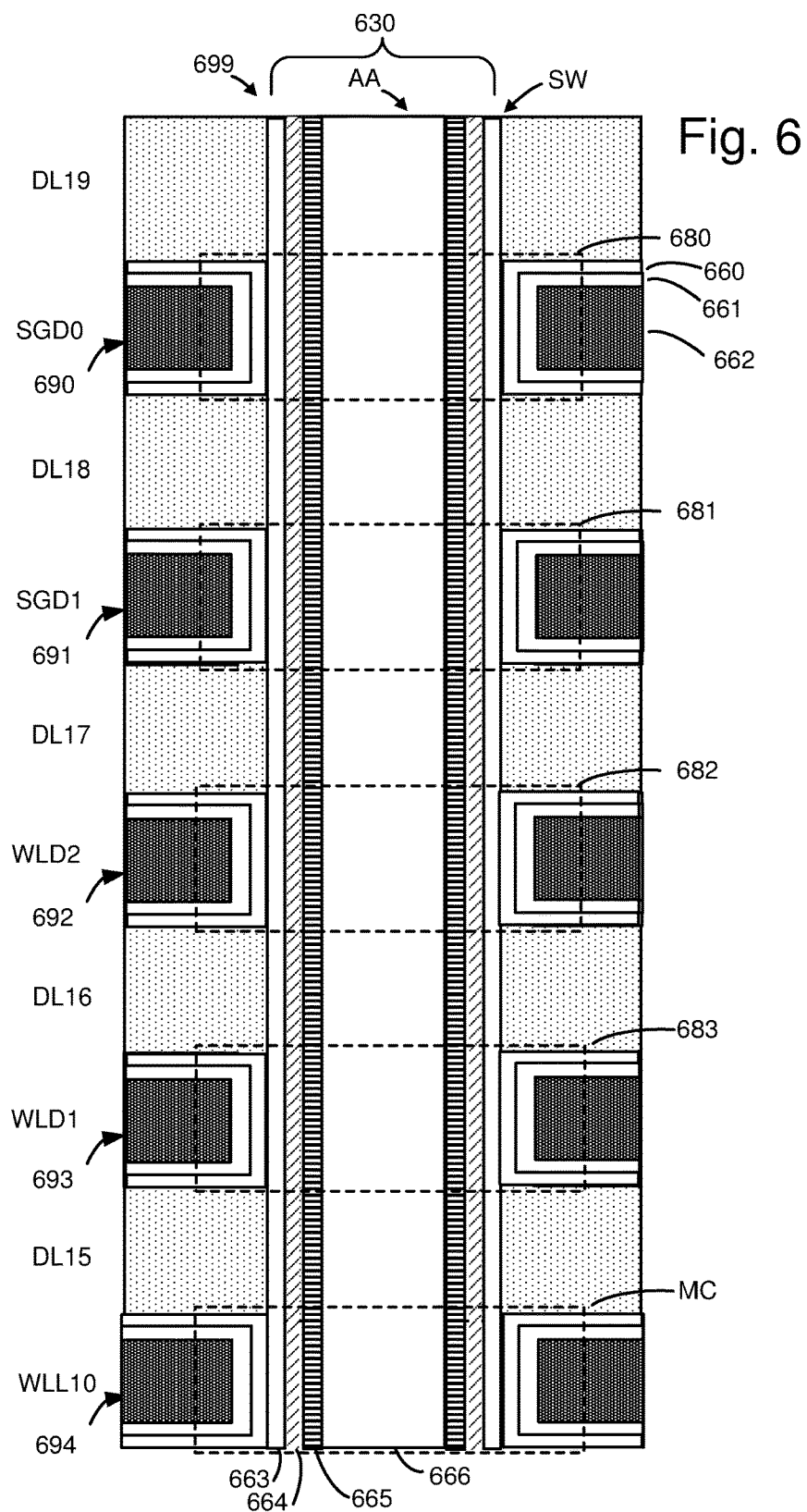
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride ($Si_3N_4$) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7A depicts an example view of NAND strings in sub-blocks in a 3D configuration which is consistent with FIG. 4. Example memory cells are depicted which extend in the x direction along word lines in each sub-block. Each memory cell is depicted as a cube for simplicity. SB0 includes NAND strings 700*n*, 701*n*, 702*n* and 703*n*. SB1 includes NAND strings 710*n*, 711*n*, 712*n* and 713*n*. SB2 includes NAND strings 720*n*, 721*n*, 722*n* and 723*n*. SB3 includes NAND strings 730*n*, 731*n*, 732*n* and 733*n*. Bit lines are connected to sets of NAND strings. For example, a bit line BL0 is connected to NAND strings 700*n*, 710*n*, 720*n* and 730*n*, a bit line BL1 is connected to NAND strings 701*n*, 711*n*, 721*n* and 731*n*, a bit line BL2 is connected to NAND strings 702*n*, 712*n*, 722*n* and 732*n*, and a bit line BL3 is connected to NAND strings 703*n*, 713*n*, 723*n* and 733*n*. A sense circuit may be connected to each bit line. For example, sense circuits 400, 400*a*, 400*b* and 400*c* are connected to bit lines BL0, BL1, BL2 and BL3, respectively. The NAND strings are examples of vertical memory strings, e.g., vertical strings, which extend upward from a substrate.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 are connected to WLL4.

FIG. 7B depicts word line and SGD layers in an example set of blocks which is consistent with FIG. 4. Blocks BLK0, BLK1, BLK2 and BLK2 are depicted. The word line layers (WLL) in each block are depicted and long with example SGD lines. One SGD line is provided in each sub-block. BLK0 includes sub-blocks SB0, SB1, SB2 and SB3. Each circle represents a memory hole or string. The sub-blocks are elongated in the x direction and contain thousands of memory strings in practice. Additionally, many more blocks beyond those depicted are arranged in a row on the substrate. The word line layers and SGD/SGS layers may receive voltages from a row decoder 2101. See also FIGS. 21A and 21B.

FIG. 8A depicts an example Vth distribution of memory cells, where four data states are used, in a first read situation compared to a second read situation. The data states are represented by Vth distributions 810, 811, 812 and 813 for the Er (erased), A, B and C states, respectively, in the second read situation, and by the Vth distributions 810*a*, 811*a*, 812*a* and 813*a*, respectively, in the first read situation. In some cases, as shown, the lower states have a lower Vth in the first read situation compared to the second read situation, while the higher states have a higher Vth in the first read situation compared to the second read situation. The mid-range states, which are between the lower states and the higher states, may have a same, or nearly the same, Vth in the first and second read situations.

In other cases, the mid-range and higher states may have a same Vth in the first and second read situations. For example, since a read operation for a page typically applies a read voltage for a lower state followed by a read voltage for a higher state, the cells of the higher states can be affected by the read of the lower states, and can transition toward the second read situation, such that the Vth upshift depicted in FIG. 8A is reduced.

The optimum read voltages generally are midway between the Vth distributions of adjacent data states. Accordingly, as the Vth distribution shifts, the optimum read voltages shift. For the second read situation, the optimum read voltages for the A, B and C states are VrA2, VrB2 and VrC2, respectively. For the first read situation, the optimum read voltages for the A, B and C states are VrA1, VrB1 and VrC1, respectively, where VrA2>VrA1, VrB2>VrB1 and VrC2<VrC1. During a programming operation, the verify voltages are VvA, VvB and VvC.

Each read voltage demarcates a lower boundary of a data state of a plurality of data states. For example, VrA1 or VrA2 demarcate a lower boundary of the A state.

The optimum read voltages are therefore different for the first read situation compared to the second read situation. In one approach, the optimum read voltages of the second read condition are used and a conditioning operation is periodically performed to ensure the cells are in, or close to, the second read condition when they are read.

Referring still to FIG. 8A, the Vth distributions 810, 811, 812 and 813 would be seen if the distributions are taken right after programming, in the second read situation. If we wait for a while, e.g., one hour, the Vth distributions 810*a*, 811*a*, 812*a* and 813*a* would be obtained, in the first read situation. If we take another distribution after a read operation, the Vth distributions 810, 811, 812 and 813 would be seen again. The read voltages may be optimized for the second read situation so that a number of read errors would be increased if the cells are in the first read situation.

The first read situation can occur when there is a long delay since a last programming or read operation. An example sequence is: program a block, wait for one hour, then read the block. The first read situation can also occur when there is a power down/power up. An example sequence is: program a block, power down/power up, then read the block. The first read situation can also occur when there is a program or read of other blocks. An example sequence is: program one block, program another block, then read the one block.

FIG. 8B depicts example bit sequences for lower and upper pages of data, and associated read voltages, for the Vth distributions of FIG. 8A. An example encoding of bits for each state is 11, 10, 00 and 01, respectively, in the format of upper page (UP) bit/lower page (LP) bit. A LP read may use VrA and VrC and an UP read may use VrB. A lower or upper bit can represent data of a lower or upper page, respectively. Three programmed data states A, B and C are used in addition to the erased state, Er. With these bit sequences, the data of the lower page can be determined by reading the memory cells using read voltages of VrA and VrC. The lower page (LP) bit=1 if Vth<=VrA or Vth>VrC. LP=0 if VrA<Vth<=VrC. The upper page (UP) bit=1 if Vth<=VrB and LP=0 if Vth>VrB. In this case, the UP is an example of a page which can be determined by reading using one read voltage applied to a selected word line. The UP is an example of a page which can be determined by reading using two read voltages applied to a selected word line. The read voltages are depicted as VrA, VrB and VrC, where each of these can represent the first or second read values, whichever is optimal.

FIG. 8C depicts an example Vth distribution of memory cells, where eight data states are used, in a first read situation compared to a second read situation. For the Er, A, B, C, D, E, F and G states, we have Vth distributions 820, 821, 822, 823, 824, 825, 826 and 827, respectively, in the second read situation, and 820a, 821a, 822a, 823a, 824a, 825a, 826a and 827a, respectively, in the first read situation. For the A, B, C, D, E, F and G states, we have verify voltages VvA, VvB, VvC, VvD, VvE, VvF and VvG, respectively, read voltages VrA2, VrB2, VrC2, VrD2, VrE2, VrF2 and VrG2, respectively, in the second read situation, read voltages VrA1, VrB1, VrC1, VrD1, VrE1, VrF1 and VrG1, respectively, in the first read situation, and example encoding of bits of 111, 110, 100, 000, 010, 011, 001 and 101, respectively. The bit format is: UP/MP/LP.

This example indicates the shift in the Vth distribution for the first read situation compared to the second read situation is relatively larger when the data state is relatively lower or higher, than when the data state is mid-range. The shift may be progressively larger for progressively lower or higher data states. In one example, the read voltages of VrA1, VrB1, VrC1 and VrD1 are optimal for the relatively lower states of A, B, C and D, respectively, and the read voltages of VrE1, VrF1 and VrG1 are optimal for the relatively higher states of E, F and G, respectively, in the first read situation. Similarly, the read voltages of VrA2, VrB2, VrC2 and VrD2 are optimal for the relatively lower states of A, B, C and D, respectively, and the read voltages of VrE2, VrF2 and VrG2 are optimal for the relatively higher states of E, F and G, respectively, in the second read situation. Furthermore, VrA1<VrA2, VrB1<VrB2, VrC1<VrC2, VrD1<VrD2, VrE1>VrE2, VrF1>VrF2 and VrG1>VrG2. Thus, the lower of two read voltages per state is optimal in the first read situation for the lower states and the higher of two read voltages per state is optimal in the first read situation for the higher states, in one possible implementation.

FIG. 8D depicts example bit sequences for lower, middle and upper pages of data, and associated read voltages. In this case, the memory cells each store three bits of data in one of eight data states. Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using read voltages (e.g., control gate or word line voltages) of VrA and VrE. The lower page (LP) bit=1 if Vth<=VrA or Vth>VrE. LP=0 if VrA<Vth<=VrE. Generally, a memory cell can be sensed by sense circuitry while a read voltage is applied. If the memory cell is in a conductive state at a sense time, its threshold voltage (Vth) is less than the read voltage. If the memory cell is in a non-conductive state, its Vth is greater than the read voltage.

The read voltages which are used to read a page of data are determined by transitions from 0 to 1 or 1 to 0 in the encoded bits (code word) for each state. For example, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, the MP bit transitions from 1 to 0 between A and B, from 0 to 1 between C and D, and from 1 to between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, the UP bit transitions from 1 to 0 between B and C, and from 0 to 1 between F and G. Accordingly, the read voltages for the UP are VrC and VrG.

The read voltages are depicted as VrA, VrB, VrC, VrD, VrE, VrF and VrG, where each of these can represent the first or second read values, whichever is optimal.

FIG. 8E depicts an example Vth distribution of memory cells, where sixteen data states are used, in a first read situation compared to a second read situation. Programming using four bits per cell (16 levels) can involve lower, lower-middle, upper-middle and upper pages. The data states are represented by Vth distributions 830, 831, 832, 833, 834, 835, 836, 837, 838, 839, 840, 841, 842, 843, 844 and 845 for the S0, S1, S2, S3, S4, S5, S6, S7, S8, S9, S10, S11, S12, S13, S14 and S15 states, respectively, in the first read situation, by Vth distributions 830a, 831a, 832a, 833a, 834a, 835a, 836a, 837a, 838a, 839a, 840a, 841a, 842a, 843a, 844a and 845a, respectively, in the second read situation, and an example encoding of bits for each state is 1111, 1110, 1100, 1101, 1001, 1000, 1010, 1011, 0011, 0010, 0000, 0100, 0110, 0111, 0101 and 0001, respectively, in the format of upper page (UP) bit/upper middle (UMP) page bit, lower middle (LMP) page bit, lower page (LP) bit, as depicted in FIG. 8E and FIG. 8F. The verify voltages are VvS1, VvS2, VvS3, VvS4, VvS5, VvS6, VvS7, VvS8, VvS9, VvS10, VvS11, VvS12, VvS13, VvS4 and VvS15. The optimum read voltages are VrS1b, VrS2b, VrS3b, VrS4b, VrS5b, VrS6b, VrS7b, VrS8b, VrS9b, VrS10b, VrS11b, VrS12b, VrS13b, VrS14b and VrS15b in the second read situation and VrS1a, VrS2a, VrS3a, VrS4a, VrS5a, VrS6a, VrS7a, VrS8a, VrS9a, VrS10a, VrS11a, VrS12a, VrS13a, VrS14a and VrS15a in the first read situation for states S1, S2, S3, S4, S5, S6, S7, S8, S9, S10, S11, S12, S13, S14 and S15, respectively.

FIG. 8F depicts example bit sequences for lower, lower middle, upper middle and upper pages of data, and associated read voltages, for the Vth distributions of FIG. 8E. A LP read may use VrS1, VrS3, VrS5, VrS7, VrS9 and VrS13. A LMP read may use VrS2, VrS6, VrS10, VrS12 and VrS14. An UMP read may use VrS4, VrS11 and VrS15. An UP read may use VrS8. The read voltages are depicted as VrS1, VrS2, VrS3, VrS4, VrS5, VrS6, VrS7, VrS8, VrS9, VrS10, VrS11, VrS12, VrS13, VrS4 and VrS15, where each of these can represent the first or second read values, whichever is optimal.

FIG. 9 depicts a waveform of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 900 includes a series of program voltages 901, 902, 903, 904, 905, . . . 906 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 910) may be applied after each of the program voltages 901 and 902. A-, B- and C-state verify voltages of VvA, VvB and VvC (waveform 911) may be applied after each of the program voltages 903 and 904. After several additional program loops, not shown, E-, F- and G-state verify voltages of VvE, VvF and VvG (waveform 912) may be applied after the final program voltage 906.

FIG. 10A depicts a plot of example waveforms in a programming operation. The time period shown represents one program-verify iteration. The horizontal axis depicts time and the vertical axis depicts word line voltage, Vwl. A program voltage 1000 is applied to a selected word line from t0-t4 and reaches a magnitude of Vpgm. The program voltage can temporarily pause at an intermediate level such as Vpass to avoid a single large transition which can have undesired coupling effects. A pass voltage 1005 is applied to the unselected word lines from t0-t19 and reaches a magnitude of Vpass, which is sufficiently high to provide the cells in a conductive state so that the sensing (e.g., verify) operations can occur for the cells of the selected word line. The pass voltage includes an increasing portion 1005a, a fixed amplitude portion 1005b, for instance, at Vpass and a decreasing portion 1005c. Optionally, the pass voltage may be increased sooner relative to the program voltage so that Vpass is reached by t0.

A verify voltage 1010 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. A single sense time may be used during each verify voltage. The waveform decreases from VvG to 0 V or other steady state level from t15-t16.

For the unselected word lines, the decrease in Vpass will cause the cells to transition from a conductive state to a non-conductive state. In particular, when the Vpass falls below the Vth of a cell, the channel of the cell will become cutoff, e.g., the cell will become non-conductive. The dotted line at t18 indicates when a cell with Vth=VvG becomes non-conductive. When a cell becomes non-conductive, it acts as a capacitor in which the control gate is one plate and the channel is another plate. As the pass voltage 1005 decreases from VvG to 0 V, the channel is capacitively coupled down by a similar amount, as represented by a dashed line 1015a in FIG. 10B.

The plot 1012 is shown increasing relatively quickly but this is not to scale. In practice, the verify operation, e.g., from t5-t19, may consume about 100 microseconds, while the coupling up of the word line may be significantly longer, in the millisecond range such as 10 milliseconds.

FIG. 10B depicts a plot of a channel voltage (Vch) corresponding to FIG. 10A. The channel is capacitively coupled down to a minimum level of Vch_min from t18-t19 and then begins to return to its original, starting level of, e.g., 0 V from t19-t20. If the voltages of the word lines are allowed to float starting at t19, the voltages (plot 1012) are capacitively coupled higher by the increase in Vch (plot 1015b). The voltages of the word lines float to a peak level of Vwl_coupled_up. For example, VvG may be 5 V, so that there is a 5 V change in the word line voltage, e.g., 5-0 V, which is coupled to the channel. Vch_min may be about −5 V in this example. There is a 5 V increase in Vch which is coupled to the word line, e.g., control gate, of the cells. Vwl_coupled_up may be about 4 V.

In contrast, if the voltages of the selected and unselected word lines are driven at a steady state level for a specified time after Vpass is ramped down, the coupling up of the word lines can be prevented or reduced. The plot 1005d shows the word lines being driven at ground (0 V) or other steady state level which is relatively low, compared to Vpass, e.g., perhaps 0-10% of Vpass. In this example, the drivers of the unselected word lines are commanded to output Vpass at t0. However, due to an RC time constant, some time is required to reach Vpass. Similarly, the drivers of the unselected word lines are commanded to output 0 V at t17, but some time is required to reach 0 V, e.g., at about t19. The unselected word lines are actually driven at 0 V from t19-t20 in this example although the driver tries to drive them at 0 V from t17-t20. At t20, the drivers of the unselected word lines are disconnected from the word lines so that the word line voltages can float slightly higher, as depicted by plot 1005e. However, this coupling up is much smaller than that depicted by plot 1012. A small amount of coupling up of the word lines such as 1-2 V (compared to 5 V) will not significantly change the Vth of the associated memory cells and is therefore acceptable in this example.

By grounding the word lines for a specified amount of time after Vpass is stepped down, coupling up of the word lines can be reduced so that the Vth of the cells is not significantly shifted. The cells essentially remain in the first read situation. In this example, the read voltages of FIGS. 8A, 8C and 8E which correspond to the first read situation may be used in a subsequent read operation.

FIG. 10C depicts a plot of example waveforms in a read operation, where Vpass is applied continuously with read voltages of different pages. A read operation is similar to a verify operation as both are sensing operations and both can provide a coupling up of the word line voltages. The horizontal axis depicts time and the vertical axis depicts word line voltage, Vwl. A pass voltage 1025 is applied to the unselected word lines from t0-t9 and reaches a magnitude of Vpass. The pass voltage includes an increasing portion 1025a, a portion 1025b at Vpass and a decreasing portion 1025c. A read voltage includes a separate waveform 1120 (at levels of VrA2 and VrE1), 1121 (at levels of VrB2, VrD2 and VrF1) and 1122 (at levels of VrC2 and VrG1) for each of the lower, middle and upper pages, respectively, consistent with FIGS. 8C and 8D. The read voltages are applied to the selected word line. An eight-level memory device is used in this example.

When VrA2, VrE1, VrB2, VrD2, VrF1, VrC2 and VrG1 are applied, the sense time may be t2, t3, t4, t5, t6, t7 and t8, respectively.

For the unselected word lines, the decrease in Vpass will cause the cells to transition from a conductive state to a non-conductive state, as discussed. The dotted line at t13 indicates when a cell with Vth=VvG becomes non-conductive. As the pass voltage 1025 decreases from VvG to 0 V, the channel is capacitively coupled down by a similar amount, as represented by the dashed line of plot 1035a in FIG. 10D.

In another option, the voltages of the selected and unselected word lines are driven at a steady state level such as 0 V for a specified time after the ramp down of Vpass. The plot 1025d shows the word lines being driven at ground (0 V) or other steady state level which is relatively low. The drivers of the unselected word lines are commanded to output 0 V at t9, but some time is required to reach 0 V, e.g., at about t11. The unselected word lines are actually driven at 0 V from t11-t12. The driver tries to drive the unselected word lines at 0 V from t9-t12. At t12, the drivers of the unselected word lines are disconnected from the word lines so that the word line voltages can float slightly higher, as depicted by plot 1025e.

FIG. 10D depicts a plot of a channel voltage (Vch) corresponding to FIG. 10C. The channel is capacitively coupled down to a minimum level of Vch_min from t13-t14 and then begins to return to its original, starting level of, e.g., 0 V from t14-t15. If the voltages of the word lines are allowed to float starting at t14, the voltages (plot 1032) are capacitively coupled higher by the increase in Vch (plot 1035b). The voltages of the word lines float to a peak level of Vwl_coupled_up, as discussed.

FIG. 10E depicts the waveforms of FIG. 10C showing a decay of the coupled up voltage of the word line. The time scale is different than in FIG. 10A-10D and represents a longer time period such as one hour. The plot 1123 depicts the read voltages in a time period t0-t1. A plot 1125 depicts an increase in Vwl to a coupled up level (Vwl_coupled_up) due to coupling (in a time period t1-t2) followed by a decay of Vwl in a time period t2-t3. Generally, the increase in Vwl occurs relatively quickly compared to the time period of the decay. In case the word lines are grounded as discussed, they will not be coupled up as depicted by plot 1125.

FIG. 10F depicts a plot of a channel voltage consistent with FIG. 10E. A decrease to Vch_min followed by an increase (plot 1126) occurs in the time period t1-t2. Vch is about 0 V from t2-t3 (plot 1127).

FIG. 10G depicts a plot of a Vth of a memory cell connected to the coupled up word line, consistent with FIGS. 10E and 10F. For a cell in an example data state, such as the A state, the Vth is at an initial level, Vth_initial, from t0-t1. Vth increases from t1-t2 (plot 1128) due to coupling at the same time as the increase in Vch, to a peak level of Vth_coupled_up. The Vth then gradually decreases back to Vth_initial from t1-t3. This example applies when the word line voltage is allowed to be coupled up rather than being grounded, as discussed.

FIG. 10H depicts a plot of example waveforms in a read operation, where Vpass is applied separately during read voltages of different pages. Vpass is ramped up and then back down separately during the read voltages of each of the lower, middle and upper pages, as depicted by plots 1140, 1141 and 1142, respectively, which extend from t0-t5, t5-t10 and t11-t15, respectively. This example is for an eight-state memory device. The example can be modified for fewer states (e.g., four states and two pages) or additional states (e.g., sixteen states and four pages). In one approach, the grounding of the word line voltages occurs after each ramp down of Vpass and one sense time per read voltage is used. For example, the plots 1140b, 1141b and 1142b may represent a grounding voltage being applied.

In another approach, the word line voltages are floated after each ramp down of Vpass. For example, the plots 1140c, 1141c and 1142c may represent the word line voltages being floated and coupled up. The amount of the coupling may be limited by the time between the ramp up of Vpass for each page.

In a first portion of the read operation, the A and E states are read using a read voltage waveform of plot 1140a. When VrA2 and VrE1 are applied, the sensing times may be t2 and t3, respectively. In a second portion of the read operation, the B, D and F states are read using a read voltage waveform 1141a. When VrB2, VrD2 and VrF1 are applied, the sensing times may be t6, t7 and t8, respectively. In a third portion of the read operation, the C and G states are read using a read voltage waveform 1142a. When VrC2 and VrG1 are applied, the sensing times may be t12 and t13, respectively.

Figure 11C:
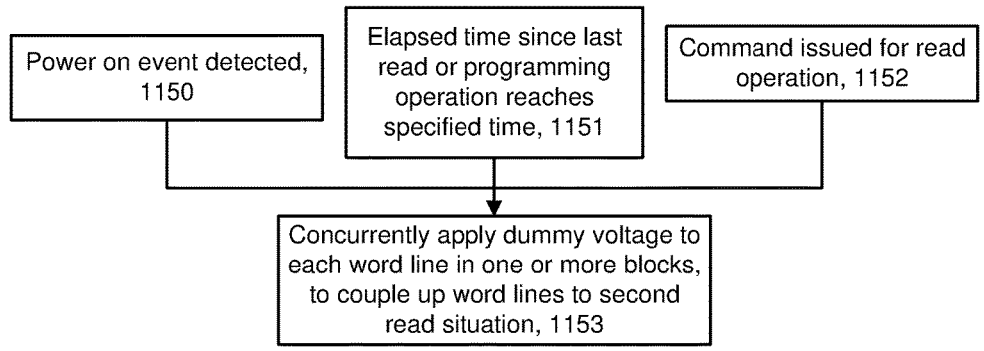
FIG. 11C depicts a process for applying a dummy voltage to word lines in one or more blocks to couple up the word lines to the second read situation.

FIG. 11A depicts a plot of an example dummy voltage of a word line and a subsequent coupled up voltage of the word line. A dummy voltage or voltage pulse can be applied to one or more word lines in a block to avoid the first read situation and to cause the cells to transition to the second read situation. The dummy voltage triggers the coupling up of the word line voltage so that the second read situation is present when a read command is issued. One option is to apply the dummy read voltage in response to the issuance of a read command from the controller. To avoid a read time penalty, another option is to apply the dummy read voltage in response to a specified trigger such as the passage of a specified amount of time, e.g., 1-2 hours, since a last sensing operation. See FIG. 11C. This approach provides a periodic coupling up of Vwl so that a read operation can occur without delay in the normal read situation. Another specified trigger is the detection of a power on event. Other triggers are possible as well. For example, the dummy voltage can be applied when the memory device is in an idle state or when no other tasks with a higher priority are pending.

The magnitude of the dummy voltage, Vdummy, should be at least as high as a highest verify voltage of the different verify voltages used to program memory cells to different data states, in one implementation. For example, for a memory device with four, eight or sixteen states, Vdummy should be at least VvC, VvG or VvS15, respectively. This ensures that the maximum coupling down of Vch and the maximum coupling up of Vwl will occur.

One approach to applying a dummy voltage is to apply the voltage to all data word lines in a block concurrently. Another approach is to apply the voltage to fewer than all data word lines in a block concurrently. When the dummy voltage is applied, in one approach, the bit line voltage Vbl=0 V, and the voltages of the select gate control lines and the dummy word lines is sufficiently high to provide the select gate transistors and the dummy memory cells, respectively, in a conductive state, e.g., so the channel is not cutoff. By applying the dummy voltage at a sufficiently high level and then decreasing it back to 0 V, for instance, the normal read situation is provided before initiating a read operation.

The horizontal axis depicts time and the vertical axis depicts word line voltage, Vwl. A dummy voltage 1100 (e.g., a voltage pulse or waveform) is applied to the word lines in a block from t0-t5 and reaches a magnitude of Vdummy. The voltage includes an increasing portion 1100a, a portion 1100b at Vdummy and a decreasing portion 1100c. Vdummy may be requested at t1 and 0 V may be requested at t3. The voltage drivers may be commanded to no longer provide a voltage at t5 (e.g., to disconnect the voltage drivers from the word lines) to allow the voltages to float.

A control circuit may be configured to command a voltage driver to increase voltages of the word lines from an initial level (e.g., 0 V) to an elevated level (e.g., Vdummy), and then to decrease the voltages of the word lines from the elevated level to a final level (e.g., 0 V). The control circuit, to float the voltages of the word lines, is configured to disconnect the voltage driver from the word lines a specified time (e.g., after a time duration of t5-t3) after requesting that the voltage driver decrease the voltages of the word lines from the elevated level to the final level.

At t4, the voltage falls below VvG so that the memory cells in the G state are made non-conductive state. The remaining transition of the voltage provides capacitive coupling, as discussed. Memory cells in lower states are made non-conductive when the voltage falls lower. Different contributions to the coupling up of a word line can therefore be made by the different cells connected to the word line according to their respective data states. An overall coupled up voltage on the word line will be provided.

As the dummy voltage 1100 decreases from VvG to 0 V, the channel is capacitively coupled down by a similar amount, as represented by a dashed line 1110a in FIG. 11B.

Various approaches to providing a voltage pulse as part of a conditioning operation are discussed further below. See, e.g., FIG. 16A-16H.

FIG. 11B depicts a plot of a channel voltage which is coupled down from a starting level, e.g., 0 V, and subsequently returns to the starting level, consistent with FIG. 11A. The channel is capacitively coupled down to a minimum level of Vch_min and then begins to return to its starting level from t5-t6. The voltages of the word lines are allowed to float starting at t5, so that the voltages (plot 1102) are capacitively coupled higher by the increase in Vch (plot 1110b). The voltages of the word lines float to a peak level of Vwl_coupled_up.

The dummy voltage can be implemented using firmware in the external controller combined with logic in the on-chip control circuitry. A new command can be defined in the on-chip control circuitry that applies a dummy read voltage to multiple blocks, without any host read request. This process does not involve any updates to the latches because no sensing occurs. The purpose of the dummy voltage is to place the memory array into the second read situation. With the new command, after each power up, (or periodically using a timer), we read all blocks using a multi block read command.

FIG. 11C depicts a process for applying a dummy voltage to word lines in one or more blocks to couple up the word lines to the second read situation. Various conditions can trigger the coupling up of the word lines. For example, step 1150 indicates that a power on event is detected. For instance, an event handler in a controller can determine whether a power on event has been detected. Step 1151 indicates that an elapsed time since a last read or programming operation, e.g., a last sensing operation, reaches a specified time. For example, this step can be responsive to a timer implemented by a controller. Step 1152 determines that a command has been issued for a read operation. If any of these steps occur, step 1153 is performed. This step involves concurrently applying a dummy voltage to each word line in one or more blocks to couple up the word lines to the second read situation. By concurrently applying the dummy voltage, the time allocated to the dummy voltage is minimized.

One approach is to apply a dummy voltage concurrently to all data word lines in each of one or more blocks. This can include data word lines but not dummy word lines, or both data word line and dummy word lines. Another approach is to apply the dummy voltage concurrently to fewer than all data word lines in a block in each of one or more blocks. Another approach is to apply dummy voltages one after another to different sets of word lines in a block. Another approach is to apply dummy voltages to one or more blocks at a time. See also FIG. 16A-16H.

Figure 12:
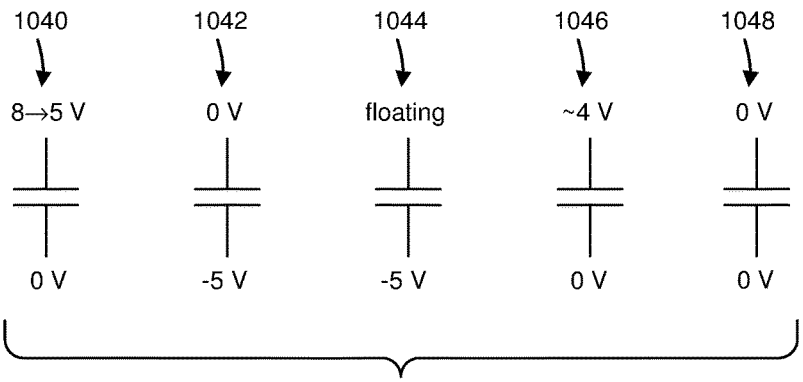
FIG. 12 depicts control gate and channel voltages on a memory cell which acts as a capacitor when the control gate voltage is decreased in a sensing operation.

FIG. 12 depicts control gate and channel voltages on a memory cell which acts as a capacitor when the control gate voltage is decreased in a sensing operation. The first read issue is caused by the stacking of word line planes or layers in 3D, where the channels of the memory cells are floating and not coupled to the substrate as in 2D Flash NAND architectures. Word line coupling and electron trapping in oxide-nitride-oxide (ONO) layers are the sources of the first read issue.

As discussed, after a read/verify operation, when the read pass voltage (Vread) applied on a word line ramps down, the G-state cells, for example, with Vth~5 V, cut off the channel when Vread reduces to 5V. The floating channel potential then is pushed down to a negative value when Vread is further reduced to Vss. Next, the negative voltage in the channel shown above (about −5 V) increases after the read operation finishes by attracting positive charges. Since the data word lines are floating, the amount of holes needed to charge up the channel is relatively small, so the selected word line can be quickly coupled up to around 4 V. The unselected word lines can similarly be coupled up. The potential on the selected word line remains at ~4 V for a while. This attracts and traps electron in the tunnel ONO layers and causes a Vth upshift, for instance, at least for the lower data states. The word line voltage thus rises to about 4 V after the read operation due to the coupling of the word line to the floating channel potential.

The top plate represents the control gate or word line and the bottom plate represents the channel. The capacitor 1040 represents a memory cell in the time period of t17-t18 in FIG. 10A or t9-t10 in FIG. 10C, where Vpass=8 V and VvG=5 V. The word line voltage transitions from 8 to 5 V and Vch=0 V. The capacitor 1042 represents a memory cell at t19 in FIG. 10B or t11 in FIG. 10C. Vwl=0 V and Vch=−5 V. The capacitor 1044 represents a memory cell just after t19 in FIG. 10A or just after t11 in FIG. 10C. Vwl floats and Vch=−5 V. The capacitor 1046 represents a memory cell after t20 in FIG. 10A or after t13 in FIG. 10C. Vwl=4 V and Vch=0 V. Here, the word line is in a maximum coupled up state. If the Vth of the memory cell is less than 4 V, the memory cell will be weakly programmed so that its Vth increases. If the Vth of the memory cell is more than 4 V, the memory cell will be weakly erased so that its Vth decreases. The capacitor 1048 represents a memory cell after a significant amount of time has passed, e.g., an hour or more. Vwl=0 V and Vch=0 V. See t3 in FIG. 10E.

When a data word line voltage floats, the amount of holes needed to charge up the channel is relatively small. As a result, the selected word line can be relatively quickly coupled up to about 4 V, for example. The potential on the selected word line remains at ~4 V for a while, attracting electrons trapped in the tunnel oxide-nitride-oxide (ONO) layers and causing a Vth up-shift. If the wait before the next read operation is long enough, the coupled up potential of the word line will be discharged, and the trapped electrons will be de-trapped. The first read situation will occur again, resulting in an elevated number of read errors if a corrective action is not taken, such as periodically applying a dummy voltage which simulates the word line coupling up effects of a sensing operation, and/or adjusting the read voltages.

Figure 13:
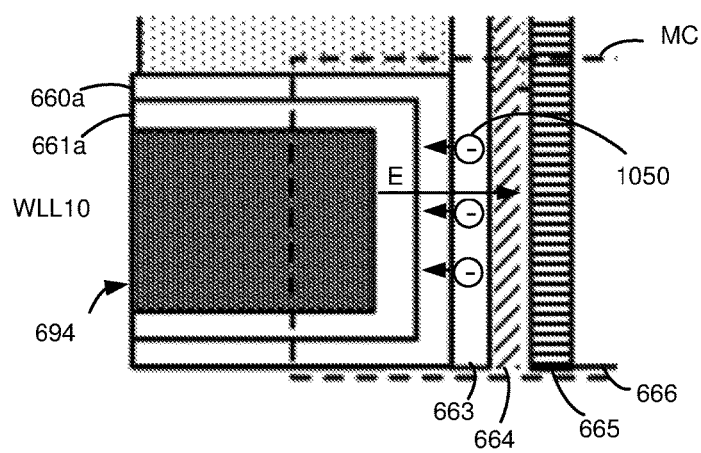
FIG. 13 depicts a portion of the memory cell MC of FIG. 6 showing electron injection into a charge trapping region during weak programming.

FIG. 13 depicts a portion of the memory cell MC of FIG. 6 showing electron injection into a charge trapping region during weak programming. The memory cell includes a control gate 694, a metal barrier 661a, a blocking oxide 660a, a charge-trapping layer 663, a tunneling layer 664, a channel 665 and a dielectric core 666. Due to the elevated word line voltage, an electric field (E) is created which attracts electrons (see example electron 1050) into the charge trapping layer, increasing the Vth. This weak programming may be caused by the Poole-Frenkel effect, in which an electrical insulator can conduct electricity. This is a kind of electron tunneling through traps. A weak erasing similarly involves an electric field which repels electrons from the charge trapping layer, decreasing the Vth.

Figure 14:
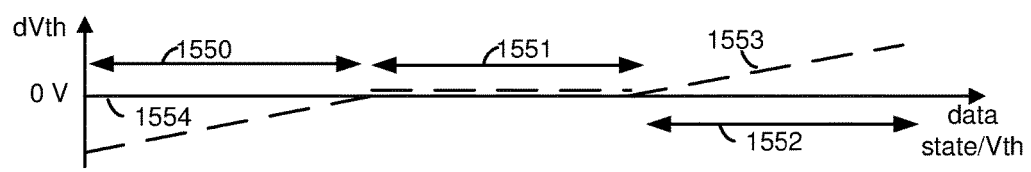
FIG. 14 depicts a plot of a shift in Vth voltage versus data state or Vth, for lower, mid-range and higher data state, consistent with FIGS. 8A, 8C and 8E.

FIG. 14 depicts a plot of a shift in Vth voltage versus data state or Vth (plot 1553), for lower, mid-range and higher data state, consistent with FIGS. 8A, 8C and 8E. As mentioned, in a first read situation, a Vth downshift may be seen for one or more lower states represented by a Vth range 1550, essentially no change in Vth may be seen in one or more midrange states represented by a Vth range 1551, and a Vth upshift may be seen for one or more upper states represented by a Vth range 1552. These shifts are relative to Vth levels in the second read situation, where dVth=0 V (plot 1554).

Figure 15:
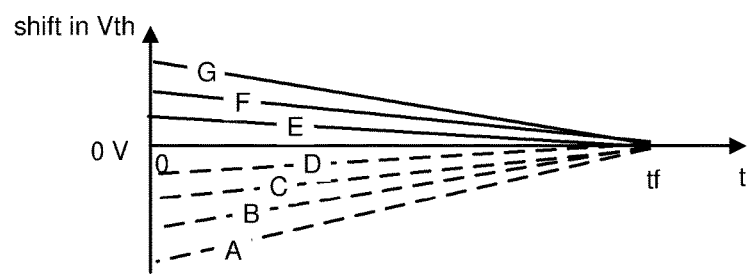
FIG. 15 depicts a plot of shift in Vth for different data states versus time.

FIG. 15 depicts a plot of shift in Vth for different data states versus time. The time t=0 represents the time of a sensing operation while the cells are in the first read situation. The shift in read voltage is largest in magnitude at this time since the word lines are discharged and the Vth of the cells is relatively far from the Vth of the second situation for each programmed data state. The shift decreases gradually in magnitude as time progresses from 0 to tf. At tf, a shift of 0 V may be realized, in one approach. Separate plots are provided for the programmed states labelled as A, B, C, D, E, F and G, where the plots for A, B, C, D show a downshift and the plots for E, F and G show an upshift.

Figure 16H:
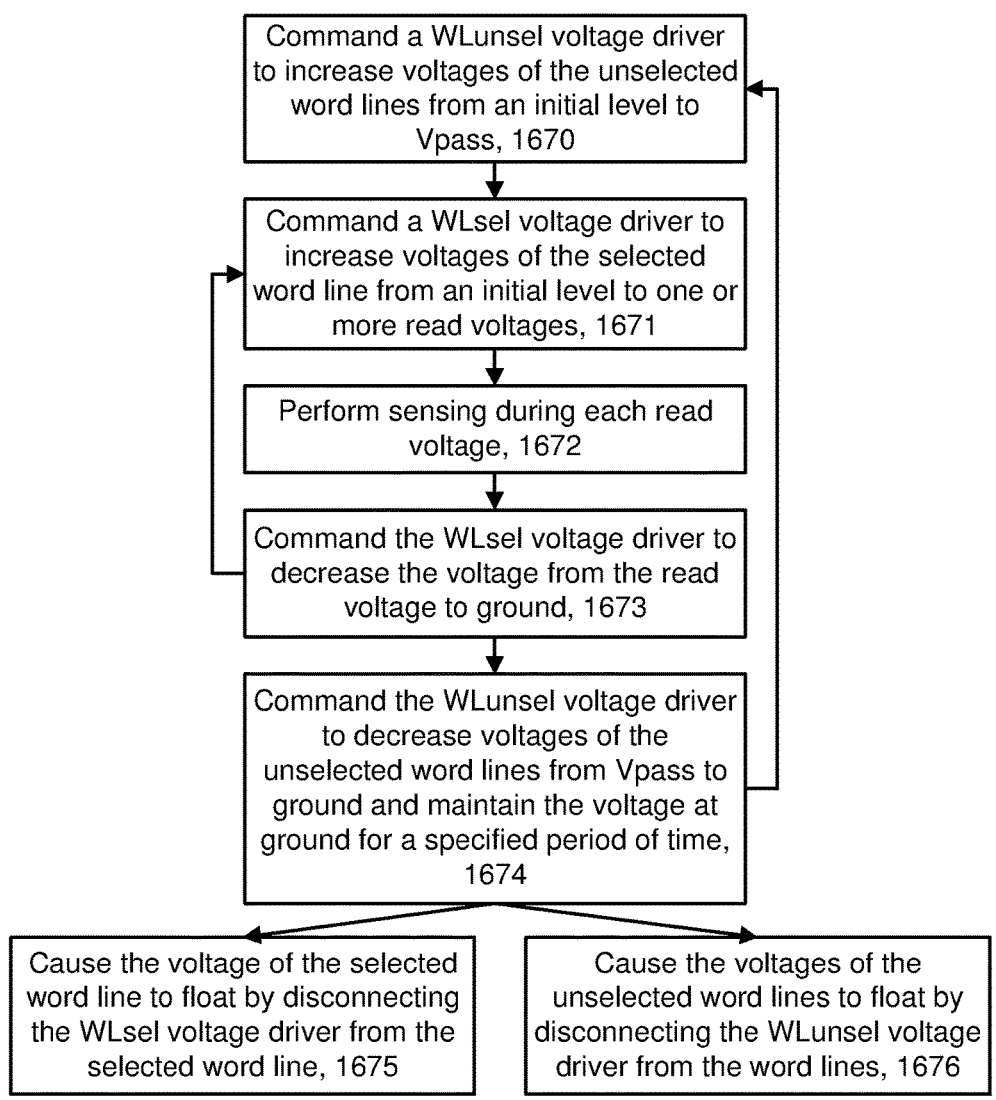
FIG. 16H depicts an example read process in which word line voltages are grounded for a specified time period to reduce coupling up of the word lines.

FIG. 16A depicts an example process for performing a conditioning operation for one or more word lines. At step 1600, a trigger event (e.g., the presence of a trigger condition or a trigger) is detected. For example, the duration since a last sensing operation or a last conditioning operation may exceed a threshold. Step 1601 includes performing a conditioning operation on one or more word lines. Generally, the trigger event can involve a memory device and the conditioning operation is performed on one or more word lines are connected to memory cells in the memory device. The trigger event can involve one or more blocks of memory cells, where the one or more word lines are connected to memory cells in the one or more blocks. At step 1602, the conditioning operation is performed, e.g., by increasing voltages of the one or more word lines from an initial level to an elevated level, maintaining the voltages at the elevated level for a specified time, then decreasing the voltages to a final level, which can be the same as the initial level. See, e.g., FIGS. 11A and 16H.

Step 1602a includes allowing the word line voltages to float so that they are coupled up by the channel. In some cases, the floating can be omitted, such as when the soft programming capability of the voltage pulse is relied on to increase the Vth of the memory cells. A voltage pulse which provide soft programming will typically be longer in duration than a voltage pulse which increases the Vth of the memory cells by providing coupling up of the word lines. Step 1603 includes waiting for the next trigger event, after which the process is repeated at step 1600.

The conditioning operation can be, e.g., an operation which provides the cells of a block in the second read situation. This can include causing the cells to transition from the first read situation to the second read situation.

A related method includes transitioning a plurality of memory cells within an array from a discharged state (e.g., first read situation) to a coupled up state (e.g., second read situation), the transitioning comprising connecting a voltage source to a plurality of word lines connected to the plurality of memory cells, the voltage source providing a voltage pulse, followed by disconnecting the voltage source from the plurality of word lines, causing the voltages of the plurality of word lines to float. The voltage pulse followed by the floating of the voltages of the plurality of word lines refreshes threshold voltages of the plurality of memory cells by counteracting a shift in the threshold voltages which has occurred over a period of time. The plurality of memory cells can be in multiple blocks and concurrently transition from the discharged state to the coupled up state.

FIG. 16B depicts an example process for performing a conditioning operation for one or more word lines of a block, where a check is performed to determine if the block is programmed before performing the conditioning operation. If a block is not at least partially programmed, one option is to skip the performing of the conditioning operation even when a trigger event is detected. Since the purpose of the conditioning operation is to provide a block in the second read situation to improve the accuracy of a read operation for the block, if the block is not at least partially programmed, it will not be read. Skipping the performing of the conditioning operation when it is not useful can save time and power. For example, the trigger event may be that a specified amount of time has passed since the last conditioning operation, which occurred while the block was programmed. Subsequently, before the specified duration has again passed, the block may have been erased. In this case, the conditioning operation can be skipped when the specified amount of time has passed since the last conditioning operation.

At step 1610, a trigger event for a block is detected, similar to step 1600. A decision step 1611 determines whether the block is programmed, e.g., at least partially programmed. For example, a controller may store data for each block which indicates whether it is programmed and this data can be read to make the determination. If decision step 1611 is true (T), step 1612 includes performing a conditioning operation on one or more word lines of the block. In this example, the trigger event can involve a particular block of a memory device, and the conditioning operation involves the same block. Step 1613 includes waiting for the next trigger event, after which the process is repeated at step 1610. If decision step 1611 is false (F), the conditioning operation is skipped and step 1613 is reached.

In this case, the plurality of memory cells are in a block, and the maintenance circuit is configured to perform the conditioning operation on the one or more word lines in response to identifying the block as a programmed block.

FIG. 16C depicts an example process for performing a conditioning operation for one or more word lines of a block in response to a read command, where the conditioning operation is performed before the read operation. This is a specific case of FIG. 16A in which the trigger event is a read command. Step 1620 indicates that a trigger event comprising a read command for a block is detected. Step 1621 includes performing a conditioning operation on one or more word lines of the block. Step 1622 includes performing a read operation on one or more word lines of the block. The read operation can occur directly after the conditioning operation is completed. See, e.g., FIG. 18A. In another option, the read operation occurs after a delay which follows the conditioning operation. See, e.g., the delay Td in FIG.

18C. Step 1623 includes waiting for the next trigger event, after which the process is repeated at step 1620.

In this example, the trigger comprises a determination that a read command involving the array is issued, and the maintenance circuit is configured execute the read command after performing the conditioning operation on the one or more word lines.

FIG. 16D depicts an example process for performing a conditioning operation for a die, where an on-die maintenance circuit determines that a trigger event is met. Step 1630 indicates that an on-die maintenance circuit detects a trigger event. Step 1631 indicates that the on-die maintenance circuit performs a conditioning operation on one or more word lines of the die. In this case, both the detection of the trigger event and the performing of the conditioning operation are handled within the die. For example, the circuit 110 of FIG. 1A is an example of an on-die maintenance circuit which is on the die 108 with the memory structure 126. See also FIG. 19A.

FIG. 16E depicts an example process for performing a conditioning operation for a die, where an off-die control circuit determines that a trigger event is met. Step 1640 indicates that an off-die control circuit detects a trigger event and issues a command for a conditioning operation for a die. Step 1641 indicates that an on-die maintenance circuit receives the command and, in response, performs the conditioning operation on one or more word lines of the die. In this case, the detection of the trigger event and the performing of the conditioning operation are handled off and on the die, respectively. This allows a central off-die control circuit to detection trigger events and issue commands for a conditioning operation for different die. For example, the controller 122 of FIG. 1A is an example of an off-die control circuit which is off the die 108. See also FIG. 19B and the off-die control circuit 1902a.

FIG. 16F depicts an example process for performing a conditioning operation for multiple die, one die at a time. Step 1650 indicates that an off-die control circuit detects a trigger event and issues a command for a conditioning operation to one die. Step 1651 indicates that an on-die maintenance circuit of the one die receives the command and, in response, performs the conditioning operation on one or more word lines of the one die. Step 1652 indicates that the on-die maintenance circuit of the one die transmits a command to perform the conditioning operation to an on-die maintenance circuit of a next die. The next die can be pre-determined such as by virtue of its proximity to the one die, for instance. At step 1653, the on-die maintenance circuit of the next die receives the command and, in response, performs the conditioning operation on one or more word lines of the next die. This process can be repeated by returning to step 1652 until all die have performed the conditioning operation, e.g., in a daisy chain manner. The process is then done at step 1654. Optionally, the last die to perform the conditioning operation reports back to the off-die control circuit to indicate that the process has been completed. See also FIG. 19C.

This approach reduces a processing burden on the off-die control circuit since it only has to send one command. The peak power consumption is also reduced because the conditioning operation is not performed concurrently on all die.

An example of FIG. 16F involves a trigger event in which the conditioning operation is performed periodically based on a timer. This approach may not consider a time since a last sensing operation since this time can differ in the different blocks and there would be additional overhead costs in keeping track of the time since a last sensing operation in each block. However, it is an option to keep track of the time since a last sensing operation in each block, where the trigger event can be that a time since a last sensing operation in any of the blocks exceeds a threshold.

FIG. 16G depicts an example process for performing a conditioning operation for multiple die concurrently. Step 1660 indicates that an off-die control circuit detects a trigger event and, in response, broadcasts a command to perform the conditioning operation to a number of different die. For example, the broadcast may be to all die in the memory device. Or, the broadcast may be to a one subset of the die, followed by another subset of the die and so forth. Each subset can include one or more die. Or, the broadcast may be replaced by a command to perform the conditioning operation which is sent to one die at a time. Step 1661 indicates that each on-die maintenance circuit receives the command and, in response, performs the conditioning operation on one or more word lines of the die. See also FIG. 19D.

FIG. 16H depicts an example read process in which word line voltages are grounded for a specified time period to reduce coupling up of the word lines. This is a circuit solution in which we ground the accessed word line plane after a read or verify operation in order to prevent coupling up of the word line voltages. The grounding is generally for a longer period of time than would otherwise be used.

At step 1670, at a first time (e.g., t0 in FIG. 10C, t0, t5 and t11 in FIGS. 10H, 18A and 18C), a voltage driver for unselected word lines (e.g., unselected word line driver 2120a in FIG. 21A) is commanded to increase voltages of the unselected word lines from an initial level (e.g., 0 V) to Vpass, a read pass voltage. Vpass is high enough to place the associated unselected cells in a conductive state. Vpass is then maintained at the elevated level for a specified time.

At step 1671, at the same time or after the first time (e.g., just before t2, t4 and t7 in FIG. 10C, and just before t1, t6 and t12 in FIGS. 10H, 18A and 18C), a voltage driver for the selected word lines (e.g., word line driver 2120b in FIG. 21A) is commanded to increase voltages of the selected word lines from an initial level (e.g., 0 V) to one or more read voltages.

Step 1672 includes performing sensing during each read voltage.

At step 1673, at a subsequent time (e.g., just after t3, t6 and t8 in FIG. 10C, and t2, t8 and t13 in FIGS. 10H, 18A and 18C), the voltage driver of the selected word lines is commanded to decrease the voltage from the read pass voltage to ground. This request can be for a step change or a gradual ramp decrease, for instance.

At step 1674, at a subsequent time (e.g., at t9 in FIG. 10C, and at t3, t9 and t14 in FIGS. 10H, 18A and 18C), the voltage driver of the unselected word lines is commanded to decrease the voltage from the read pass voltage to ground. This request can be for a step change or a gradual ramp decrease, for instance.

Subsequently, step 1675 includes causing the voltage of the selected word lines to float by disconnecting the driver of the selected word lines from the selected word lines and, concurrently, step 1676 includes causing the voltages of the unselected word lines to float by disconnecting the drivers of the unselected word lines from the unselected word lines. For example, the floating can begin at t11 in FIG. 10C and at t4, t10 and t15 in FIGS. 10H, 18A and 18C.

Figure 17A:
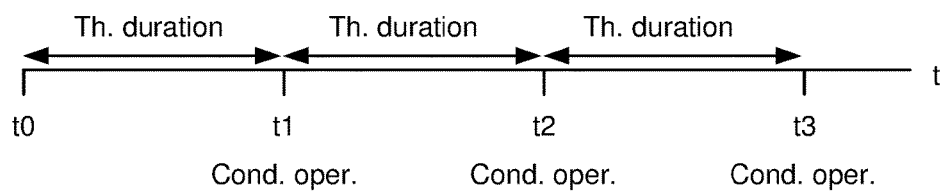
FIG. 17A depicts a time line in which a conditioning operation (Cond. oper.) is performed when a timer reaches a threshold duration (Th. duration).

FIG. 17A depicts a time line in which a conditioning operation (Cond. oper.) is performed when a timer reaches a threshold duration (Th. duration). This is one example of a trigger event in FIG. 16A-16G. The horizontal axis denotes the passage of time in FIG. 17A-17C. Th. duration is a time period or duration which a timer repeatedly counts up to, starting at t0. T0 could represent a time of the memory device being powered on, or a time of a sensing operation, for instance. The conditioning operation is performed at t1, t2 and t3, and so forth, at fixed periods, after each threshold time duration has elapsed.

In one approach, a control circuit is configured to perform the periodic issuing of a read refresh command (e.g., a command to perform the conditioning operation or, more generally, to perform an action which causes the threshold voltages of the cells to transition to a predictable level at which a read operation can be accurately performed) according to a time period which is a function of a sensed temperature. For example, the period can be shorter when the temperature is higher. A high temperature represents a worst case situation, where the discharge rate of the word line is greatest.

Figure 17B:
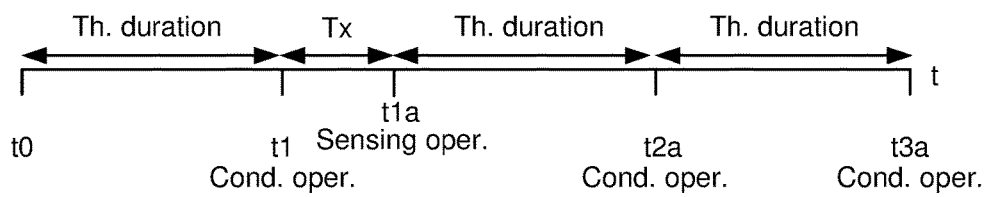
FIG. 17B depicts a time line in which the timer for a conditioning operation is reset when a sensing operation is performed.

FIG. 17B depicts a time line in which the timer for a conditioning operation is reset when a sensing operation is performed at t1a. The conditioning operation is performed at t1, after the threshold time duration (Th. duration) has elapsed relative to t0. However, before the next threshold time duration has elapsed, a sensing operation (e.g., a read or program-verify operation) occurs. At this time, the timer is reset so that the next conditioning operation occurs at t2a, after the threshold time duration has elapsed relative to the sensing operation at t1a. The timer is reset again and the next conditioning operation occurs at t3a.

Figure 17C:
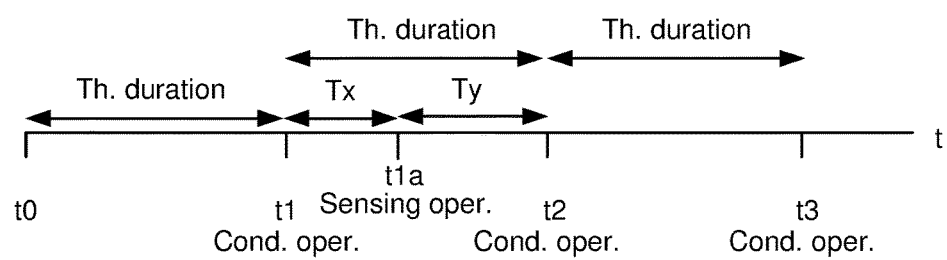
FIG. 17C depicts a time line in which the timer for a conditioning operation is not reset when a sensing operation is performed.

FIG. 17C depicts a time line in which the timer for a conditioning operation is not reset when a sensing operation is performed. In this case, the conditioning operation occurs at the set intervals regardless of the fact that a sensing operation occurred. Generally, it may be desired to proceed with the conditioning operation for multiple blocks at set intervals even when an operation occurs in one block which reduces the benefit of the conditioning operation, to provide a simpler implementation.

However, one option adjusts the conditioning operation based on the fact that the sensing operation occurred. The sensing operation can result in a coupling up of the word lines which places the cells in the second read situation. In one option, a timer is configured to track a duration since a last sensing operation in the array, and the maintenance circuit is configured to maintain the voltages of the condition operation at the elevated level for a duration which is based on the duration since the last sensing operation. The voltages are maintained at the elevated level for a shorter duration when the duration since the last sensing operation (Ty) is shorter. This is to provide a reduced amount of soft programming for embodiments where soft programming is relied on to provide the cells in the second read situation. Generally, the duration of the elevated voltage can be a function of the time since the last sensing operation such that the duration is longer when the time is longer.

FIG. 18A depicts a plot of example waveforms in a read operation similar to FIG. 10H, where a voltage pulse of a conditioning operation is applied before the read operation, consistent with the process of FIG. 16C. The waveforms of plots 1140-1142 and 1140a-1142a of FIG. 10H are repeated. The voltage pulse 1800 (an example of a conditioning waveform) is applied just before the read waveforms. As a result, there is essentially no time for the word line voltages to be coupled up from the channel. Instead, the voltage pulse on a word line may provide a weak programming of the cells connected to the word line. This helps to increase the Vth of the lower state cells, in particular, to the second read situation, to reduce read errors in the subsequent read operation. This voltage pulse without word line coupling up is effective because most read errors involve the lower states and, in particular, the erased state and the lowest programmed state (e.g., the A or S1 state).

The elevated voltage can have a magnitude of Vpass, for example. Generally, the voltage will have a greater effect in increasing the Vth of the cells through soft programming when it has a greater magnitude and/or duration. The voltage ramps up from an initial level starting at t0a, e.g., in response to a read command, reaches a peak level and maintains the peak level for a specified duration, e.g., t0b-t0a, and ramps down from the peak level to a final level from t0b-t0c. In this example, the final level and the initial level are the same, e.g., 0 V. After the voltage pulse ramps down to 0 V, for example, the read operation begins at t0. The delay between the voltage pulse and the read operation can be minimized to minimize the overall read time. The coupling up of the word lines after the read operation can also be performed as indicated by the plot 1032. The duration of the pulse, from the start of ramp up to the elevated level, to the start of ramp down from the elevated level, is TD1.

FIG. 18B depicts a plot 1810 of a channel voltage (Vch) corresponding to FIG. 18A. The plot 1810 corresponds to the plots 1035a and 1035b of FIG. 10D.

FIG. 18C depicts a plot of example waveforms in a read operation similar to FIG. 10H, where a voltage pulse of a conditioning operation is applied before the read operation, and before a delay period (Td), consistent with the process of FIG. 16C. The waveforms are similar to those in FIG. 18A except for the delay Td between the start of the ramp down of the voltage pulse 1800 at t0b and the start of the ramp up of the pass voltage of plot 1140 at t0. This delay may be sufficiently long to allow the word line voltages to be coupled up by the channel before the read operation. When the voltage pulse 1800 ramps down below VvG at t0c, the channel voltage is coupled down and then increases, as represented by plot 1805 in FIG. 18D. This cause the word line voltages (plot 1815), which are floated at this time, to be coupled higher, so that the cells transition to the second read situation.

The delay Td may be acceptable in some situations such as when data is read for use by the memory device rather than for use by an external user, who presumably is less tolerant of a delay, or when data is not frequently read such as in a cold storage application.

FIG. 18D depicts a plot of a channel voltage (Vch) corresponding to FIG. 18C. The waveform includes portions (plots 1805 and 1810) in which Vch is coupled down and then increases.

Figure 19A:
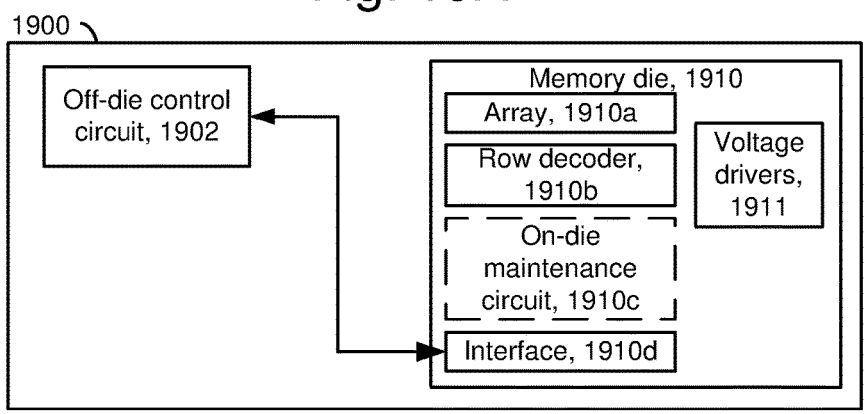
FIG. 19A depicts a memory device 1900 in which an on-die maintenance circuit 1910c determines that a trigger event is met, consistent with the process of FIG. 16D.

FIG. 19A depicts a memory device 1900 in which an on-die maintenance circuit 1910c determines that a trigger event is met, consistent with the process of FIG. 16D. An off-die control circuit 1902 has the capability to communicate with the memory die 1910 via an interface 1910d, although such communication is not made with the memory die to initiate a conditioning operation, in this example. Instead, an on-die maintenance circuit 1910c initiates the conditioning operation for memory cells in an array 1910a by instructing voltage drivers 1911 to provide specific voltage waveforms to a row decoder 1910b. For example, the voltages may comprise voltage pulses, as discussed. The on-die maintenance circuit also instructs the row decoder to switch (connect) voltages from voltage drivers to one or more word lines in an array 1910a. The on-die maintenance circuit could be the control circuit 110 of FIG. 1A, for instance.

Note that within the die, it is possible to further reduce the peak power consumption of the voltage drivers by performing the conditioning operation for groups of one or more blocks at a time. Also, when blocks are in multiple planes, a separate set of voltage drivers can be provided for each plane, and the conditioning operation can be performed for the planes sequentially, one plane at a time. This also reduces the peak power consumption. It is also possible to combine techniques such as by performing the conditioning operation one plane at a time and for groups of one or more blocks at a time within each plane.

In this case, the maintenance circuit comprises a controller on a die with the plurality of memory cells, and the trigger comprises a command issued by the controller independently of an off-die circuit.

In the conditioning operation, a read refresh command may operate on one subset of the word lines followed by another subset of the word lines, where these word lines are in one or more block. For example, the voltage pulse may be applied to a subset of word lines (fewer than all word lines in the block) in each block of multiple blocks concurrently. For instance, the voltage pulse may be applied to a first half of the word lines in each block of multiple blocks and then to a second half of the word lines in each block of the multiple blocks. Or, within one block, the voltage pulse may be applied to one subset of word lines followed by another subset of word lines, and so forth.

Figure 19B:
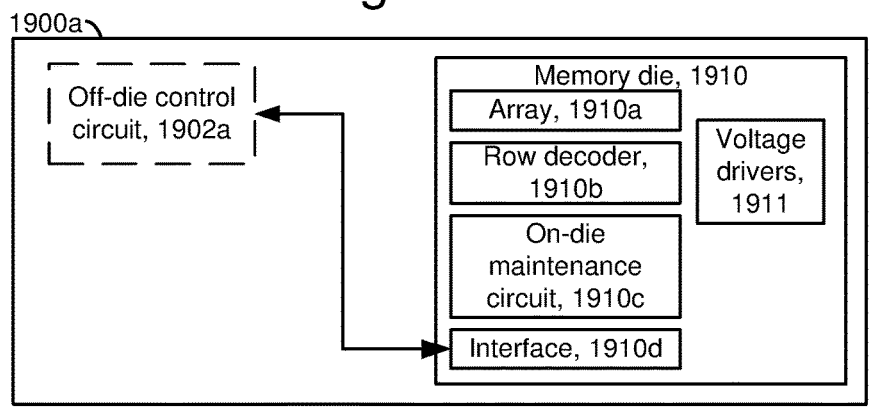
FIG. 19B depicts a memory device 1900a in which an off-die control circuit 1902a determines that a trigger event is met, consistent with the process of FIG. 16E.

FIG. 19B depicts a memory device 1900a in which an off-die control circuit 1902a determines that a trigger event is met, consistent with the process of FIG. 16E. The off-die control circuit 1902a communicates with the memory die via the interface 1910d to provide a command to the memory die to initiate a conditioning operation. In response to the command, the on-die maintenance circuit 1910c initiates the conditioning operation for memory cells in the array 1910a by instructing the voltage drivers 1911 to provide specific voltage waveforms to the row decoder 1910b, and instructing the row decoder to switch voltages from the voltage drivers to one or more word lines in the array. Optionally, the die 1910 reports back to the off-die control circuit 1902a to indicate that the process has been completed.

In this case, the maintenance circuit is on a die with the plurality of memory cells; and the trigger comprises a command received by the maintenance circuit from a controller which is off the die.

The off-die control circuit could be the controller 122 or host 140 of FIG. 1A. In the case of the host, the command to perform the conditioning operation can be considered to be a user command.

Figure 19C:
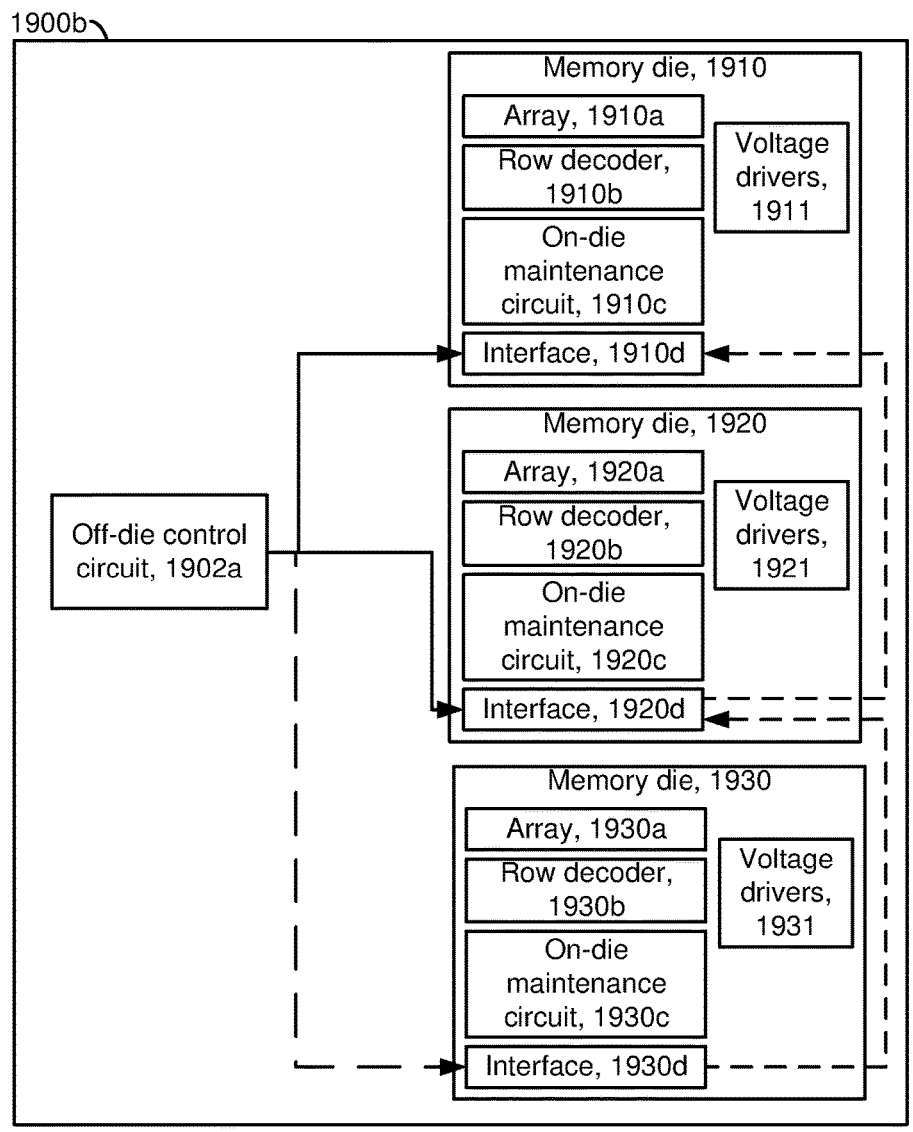
FIG. 19C depicts a memory device 1900b in which a conditioning operation is performed for multiple die, one die at a time, consistent with the process of FIG. 16F.

FIG. 19C depicts a memory device 1900b in which a conditioning operation is performed for multiple die, one die at a time, consistent with the process of FIG. 16F. Three memory die 1910, 1920 and 1930 are provided as an example. The off-die control circuit 1902a detects the trigger event and, in response, initiates the performing of the conditioning operation starting at one of the die such as the die 1930 by providing a command to the interface 1930d via a path represented by a long-dash line. In response to the command, the on-die maintenance circuit 1930c initiates the conditioning operation for memory cells in the array 1930a by instructing the voltage drivers 1931 to provide specific voltage waveforms to the row decoder 1930b, and instructing the row decoder to switch voltages from the voltage drivers to one or more word lines in the array 1930a. When the conditioning operation is completed for the memory die 1930, it sends a command via its interface 1930d to the memory die 1920 via its interface 1920d as indicated by the short-dash line.

In response to the command, the on-die maintenance circuit 1920c initiates the conditioning operation for memory cells in the array 1920a by instructing the voltage drivers 1921 to provide specific voltage waveforms to the row decoder 1920b, and instructing the row decoder to switch voltages from the voltage drivers to one or more word lines in the array 1920a. When the conditioning operation is completed for the memory die 1920, it sends a command via its interface 1920d to the memory die 1910 via its interface 1910d as indicated by the short-dash line. In response to the command, the on-die maintenance circuit 1910c initiates the conditioning operation for memory cells in the array 1910a by instructing the voltage drivers 1911 to provide specific voltage waveforms to the row decoder 1910b, and instructing the row decoder to switch voltages from the voltage drivers to one or more word lines in the array 1910a.

As mentioned, the peak power consumption of the voltage drivers is reduced since the conditioning operation is performed for one die at a time. In this case, the plurality of memory cells and the maintenance circuit are on one die among a plurality of die connected in series, and the maintenance circuit is configured to perform the conditioning operation on the one or more word lines based on command received from another die among the plurality of die in the series.

Figure 19D:
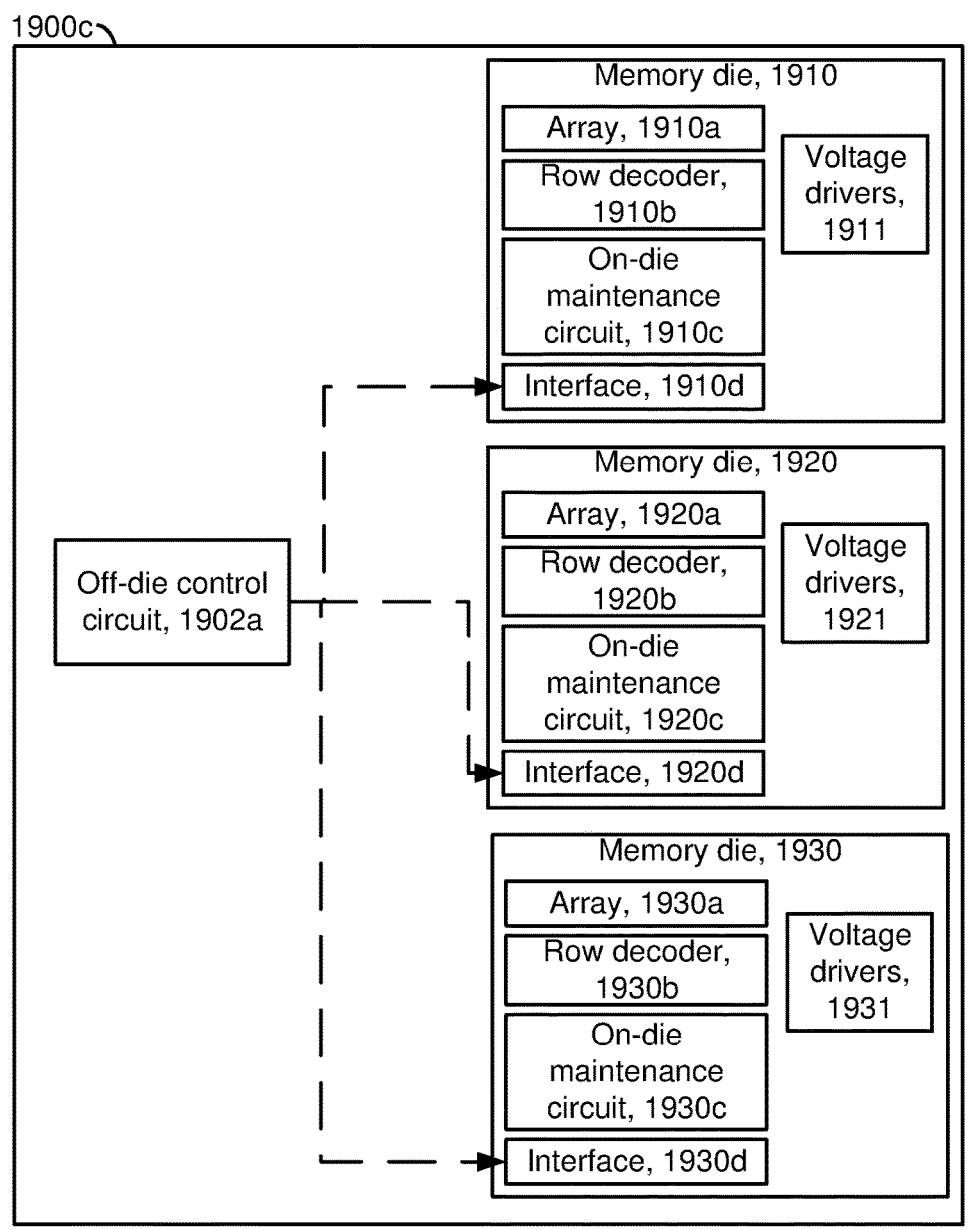
FIG. 19D depicts a memory device 1900c in which a conditioning operation is performed for multiple die concurrently, consistent with the process of FIG. 16G.

FIG. 19D depicts a memory device 1900c in which a conditioning operation is performed for multiple die concurrently, consistent with the process of FIG. 16G. The peak power consumption of the voltage drivers is higher than in FIG. 19C because the conditioning operation is performed for multiple die concurrently. However, the time used to perform the conditioning operation is reduced. Although, it is possible to reduce the peak power consumption with a time penalty by performing the conditioning operation for groups of one or more blocks at a time in each die.

The off-die control circuit 1902a detects the trigger event and, in response, initiates the performing of the conditioning operation at each of the die 1910, 1920 and 1930 by broadcasting a command which is received by each of the interfaces 1910d, 1920d and 1930d via paths represented by long-dash lines. In response to the command, the on-die maintenance circuits 1910c, 1920c and 1930c initiate the conditioning operation for memory cells in the array 1910a, 1920a and 1930a, respectively, by instructing the voltage drivers 1911, 1921 and 1931 to provide specific voltage waveforms to the row decoder 1910b, 1920b and 1920b, respectively, and instructing the row decoders 1910b, 1920b and 1930b to switch voltages from the voltage drivers to one or more word lines in the respective arrays 1910a, 1920a and 1930a, respectively.

In this case, if we consider one of the die, the plurality of memory cells and the maintenance circuit are on one die among a plurality of die, and the trigger comprises a signal which is broadcast to the plurality of die.

Figure 20:
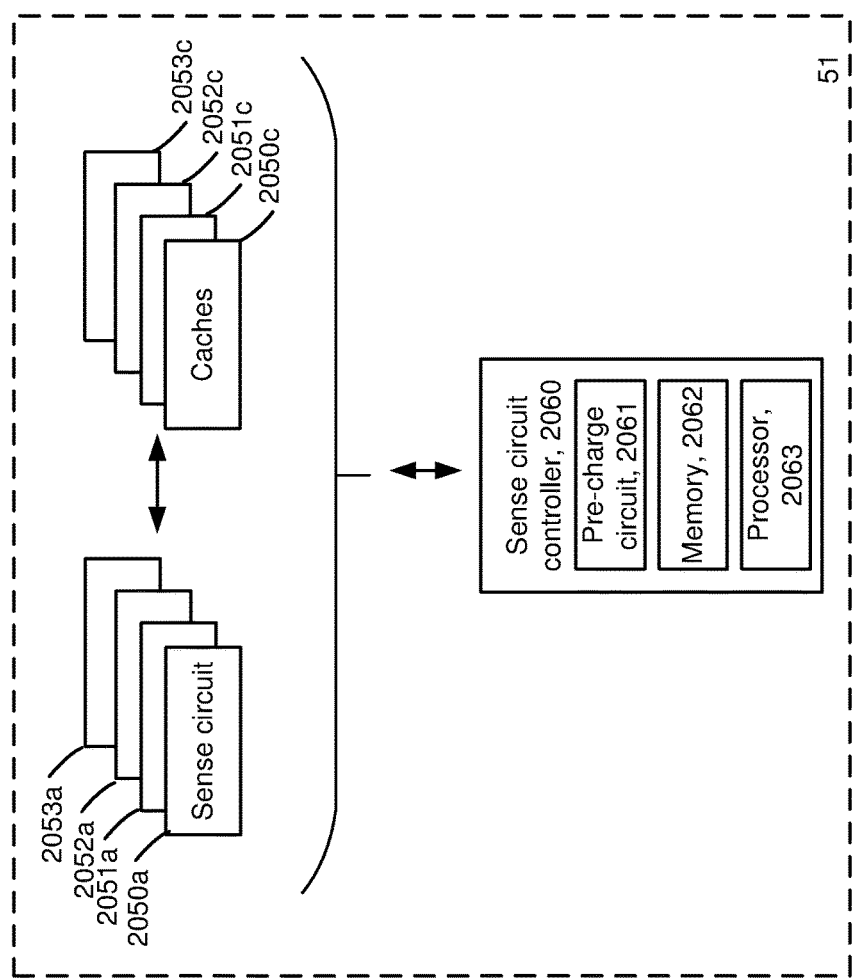
FIG. 20 depicts an example block diagram of a sense block 51 in the column control circuitry of FIG. 1A.

FIG. 20 depicts an example block diagram of a sense block 51 in the column control circuitry of FIG. 1A. The column control circuitry can include multiple sense blocks, where each sense block performs sensing, e.g., read, operations for multiple memory cells via respective bit lines.

In one approach, a sense block comprises multiple sense circuits, also referred to as sense amplifiers. Each sense circuit is associated with data latches and caches. For example, the example sense circuits 2050a, 2051a, 2052a and 2053a are associated with caches 2050c, 2051c, 2052c and 2053c, respectively.

In one approach, different subsets of bit lines can be sensed using different respective sense blocks. This allows the processing load which is associated with the sense circuits to be divided up and handled by a respective processor in each sense block. For example, a sense circuit controller 2060 can communicate with the set, e.g., sixteen, of sense circuits and latches. The sense circuit controller may include a pre-charge circuit 2061 which provides a voltage to each sense circuit for setting a pre-charge voltage. The sense circuit controller may also include a memory 2062 and a processor 2063.

Figure 21A:
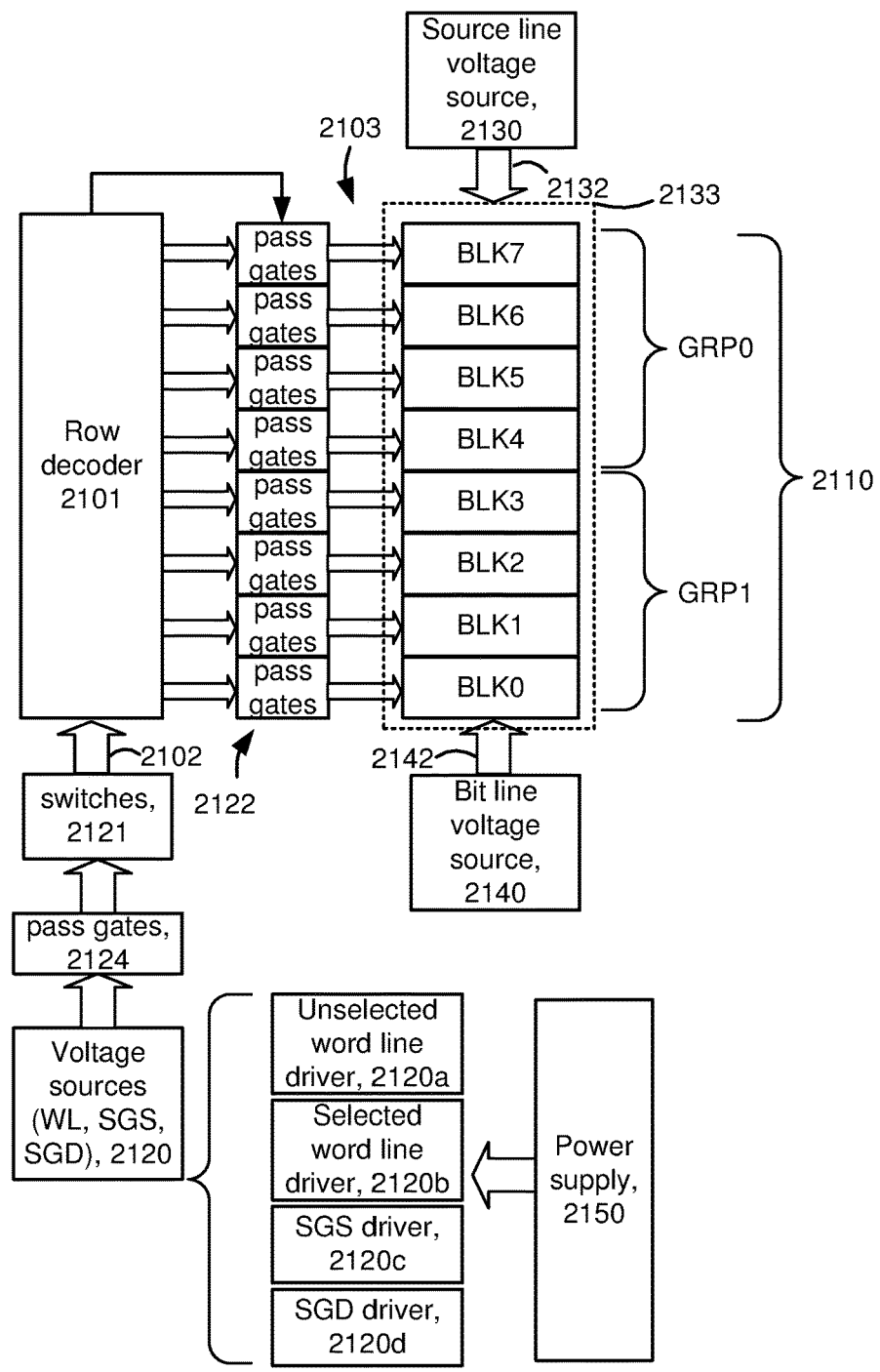
FIG. 21A depicts an example circuit for providing voltages to blocks of memory cells in a die.

FIG. 21A depicts an example circuit for providing voltages to blocks of memory cells in a die. In this example, a row decoder 2101 provides voltages to word lines and select gates of each block in set of blocks 2110. The row decoder can represent any of the row decoders discussed previously, and switches voltages from the voltage drivers to the word lines in the blocks in response to a control signal. The set could be in a plane and includes blocks BLK0 to BLK8. The row decoder provides a control signal to pass gates 2122 which connect the blocks to the row decoder. Typically, operations, e.g., program, read or erase, are performed on one selected block at a time. In contrast, the conditioning operation discussed herein can be performed on multiple blocks concurrently.

The row decoder can connect global control lines 2102 to local control lines 2103 (word lines or select gate lines). The control lines represent conductive paths. Voltages are provided on the global control lines from voltage sources 2120, which can represent any of the voltage drivers discussed previously, for instance. The voltage sources may provide voltages to switches 2121 which connect to the global control lines. Pass gates 2124, also referred to as pass transistors or transfer transistors, are controlled to pass voltages from the voltage sources 2120 to the switches 2121. The voltage sources 2120 can provided voltages on word lines (WL), SGS control gates and SGD control gates, for example. The voltage sources 2120 can include an unselected word line driver 2120a, a selected word line driver 2120b, an SGS driver 2120c and an SGD driver 2120d. A power supply 2150 is connected to the voltage drivers. The power supply has a limited output so that it is useful to provide conditioning operations as described herein which minimize the peak power consumption at a given time.

The various components, including the row decoder, may receive commands from a controller such as the state machine 112 or the controller 122 to perform the functions described herein.

A source line voltage source 2130 provides the erase voltage to the source lines/diffusion region (p-well) in the substrate via control lines 2132, in a normal erase or a soft erase. In one approach, the source diffusion region 2133 is common to the blocks. A set of bit lines 2142 is also shared by the blocks. A bit line voltage source 2140 provides voltages to the bit lines. In one possible implementation, the voltage sources 2120 are near the bit line voltage source.

As mentioned, one set of voltage drivers can be provided for the blocks in one plane. When blocks are in multiple planes, a separate set of voltage drivers can be provided for each plane.

In some cases, the pass gates are connected for a group of blocks GRP0 or GRP1.

Figure 21B:
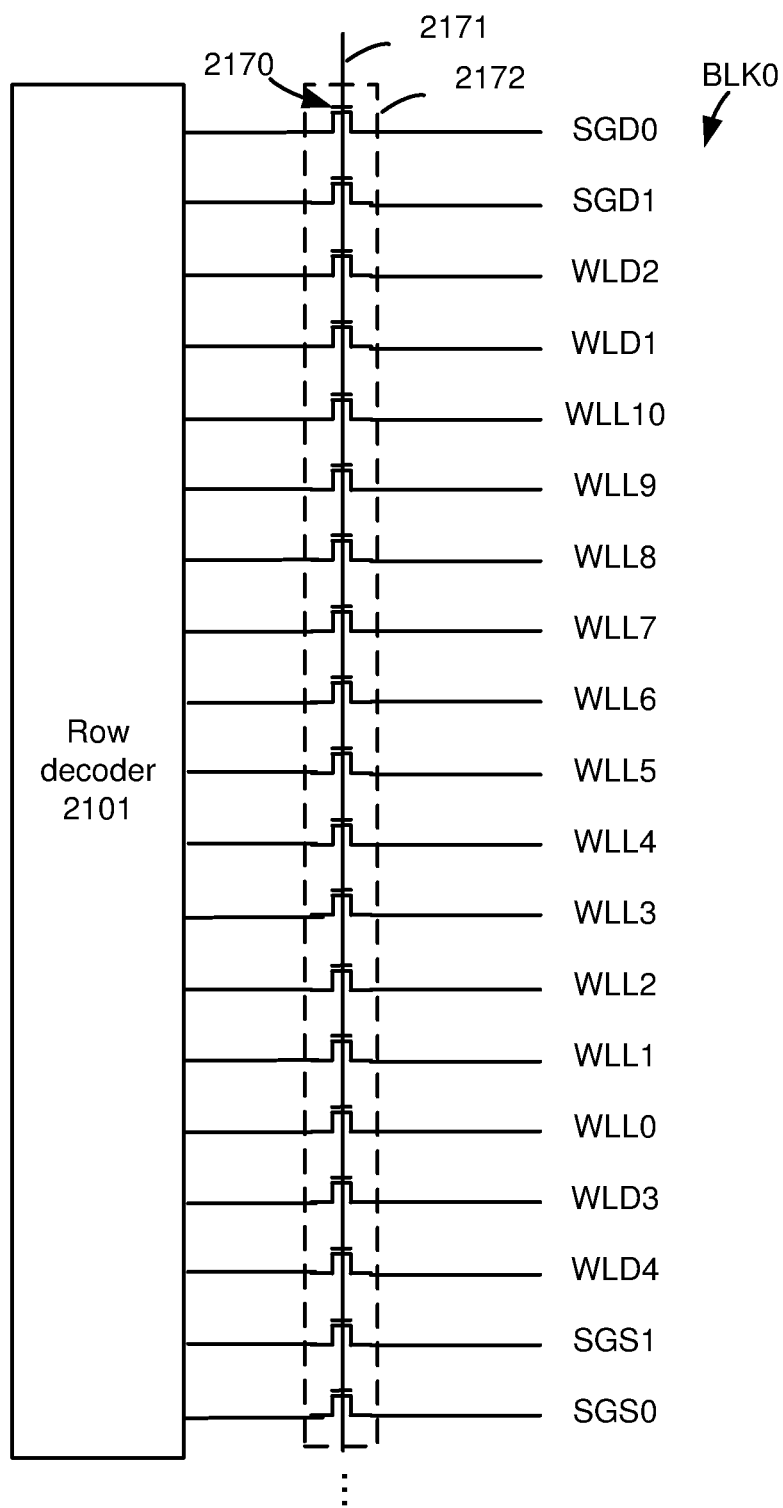
FIG. 21B depicts a subset of the example circuit of FIG. 21A showing pass gates for a block.

FIG. 21B depicts a subset of the example circuit of FIG. 21A showing pass gates for a block. The word lines and select gate lines (control lines) for BLK0 are depicted. In a set of pass gates 2172 for the block, a pass gate is connected to each control line. For example, a pass gate 2170 is connected to the SGD0 control line. The control gates of the pass gates are connected to a common path 2171. When a voltage on the path is sufficiently high, the control lines are connected to the voltage drivers via the row decoder 2101. When the voltage on the path is sufficiently low, the control lines are disconnected from the voltage drivers and floated.

In one implementation, an apparatus comprises: a plurality of memory cells within an array, the array comprising word lines, each memory cell connected to a word line; and a maintenance circuit, to perform a conditioning operation on one or more word lines of the array, configured to increase voltages of the one or more word lines to an elevated level, followed by a decrease of the voltages of the one or more word lines to a final level, wherein the maintenance circuit performs the conditioning operation on the one or more word lines in response to a trigger.

The maintenance circuit may be configured to concurrently perform a sequence comprising the increase and the decrease of the voltages of the one or more word lines for multiple word lines in one block.

In another implementation, an apparatus comprises a plurality of memory cells within an array, the array comprising word lines, each memory cell connected to a word line; and a control circuit configured to periodically issue a read refresh command to increase voltages of the word lines to an elevated level, followed by a decrease of the voltages to a final level, the command counteracts a shift in threshold voltages of the plurality of memory cells which has occurred over a period of time. The control circuit could be the on-die control circuit 110, off-die controller 122 or host 140 in FIG. 1A, for instance.

In another embodiment, an apparatus comprises means for periodically issuing an all block read refresh command for a block of memory cells, the all block read refresh command provides the block of memory cells in a refreshed state; and means for performing a read operation on the block while the block is in the refreshed state. The means described above can include the components of the memory device 100 of FIG. 1A and FIG. 2, for example. The power control module 116, for instance, controls the power and voltages supplied to the word lines, select gate lines and bit lines during memory operations. Moreover, the means described above can include the components of FIGS. 21A and 21B including the voltage drivers, switches and pass transistors. The means can further include any of the control circuits in FIGS. 1A and 2 such as the control circuitry 110 and controller 122 and any of the circuits of FIG. 19A-19D.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
    a plurality of memory cells within an array, the plurality of memory cells are arranged in a NAND string, the NAND string comprising a floating body channel, the array comprising word lines, each memory cell connected to a word line; and a maintenance circuit, to perform a conditioning operation on one or more word lines of the array, configured to increase voltages of the one or more word lines to an elevated level, followed by a decrease of the voltages of the one or more word lines to a final level, followed by floating the voltages of the one or more word lines, the conditioning operation is configured to increase a voltage in the floating body channel.

2. The apparatus of claim 1, wherein:
the maintenance circuit is configured to connect a voltage source to the one or more word lines to perform the increase and the decrease of the voltages of the one or more word lines, and to disconnect the voltage source from the one or more word lines after the decrease, to float the voltages of the one or more word lines.

3. The apparatus of claim 1, further comprising:
a timer configured to track a duration since a last sensing operation in the array, wherein the maintenance circuit performs the conditioning operation on the one or more word lines in response to a determination that the duration exceeds a threshold.

4. The apparatus of claim 1, further comprising:
a timer configured to track a duration since a last performance of the conditioning operation on the one or more word lines, wherein the maintenance circuit performs the conditioning operation on the one or more word lines in response to a determination that the duration exceeds a threshold.

5. The apparatus of claim 1, wherein:
the plurality of memory cells are in one block of the array.

6. The apparatus of claim 1, wherein:
the plurality of memory cells are in a block; and
the maintenance circuit is configured to perform the conditioning operation on the one or more word lines in response to identifying the block as a programmed block.

7. The apparatus of claim 1, wherein:
the maintenance circuit comprises a controller on a die with the plurality of memory cells; and
the maintenance circuit performs the conditioning operation on the one or more word lines in response to a command issued by the controller independently of an off-die circuit.

8. The apparatus of claim 1, wherein:
the maintenance circuit is on a die with the plurality of memory cells; and
the maintenance circuit performs the conditioning operation on the one or more word lines in response to a command received by the maintenance circuit from a controller which is off the die.

9. The apparatus of claim 1, wherein:
the plurality of memory cells and the maintenance circuit are on one die among a plurality of die connected in series; and
the maintenance circuit is configured to perform the conditioning operation on the one or more word lines based on command received from another die among the plurality of die in the series.

10. The apparatus of claim 1, wherein:
the plurality of memory cells and the maintenance circuit are on one die among a plurality of die; and
the maintenance circuit performs the conditioning operation on the one or more word lines in response to a signal which is broadcast to the plurality of die.

11. The apparatus of claim 2, wherein:
the maintenance circuit, to perform the conditioning operation, is configured to disconnect the voltage source from the one or more word lines at a specified time after requesting that the voltage source decrease the voltages of the one or more word lines from the elevated level to the final level.

12. An apparatus, comprising:
a plurality of memory cells arranged in a NAND string within an array, the NAND string comprising a floating body channel, the array comprising word lines, each memory cell connected to a word line; and
a control circuit configured to periodically issue a read refresh command to increase voltages of the word lines to an elevated level, followed by a decrease of the voltages of the word lines to a final level, followed by floating the voltages of the word lines, the read refresh command increases a voltage of the floating body channel of the NAND string due to capacitive coupling and counteracts a shift in threshold voltages of the plurality of memory cells which has occurred over a period of time.

13. The apparatus of claim 12, wherein:
the read refresh command operates concurrently on one subset of word lines of a block followed by the read refresh command operating concurrently on another subset of word lines of the block.

14. The apparatus of claim 12, wherein:
the control circuit comprises a state machine on a die with the array; and
the control circuit is configured to periodically issue the read refresh command independently of an off-die control circuit.

15. The apparatus of claim 12, wherein:
the control circuit is on a die with the array; and
the control circuit is configured to perform the periodic issuing of the command in response to commands from an off-die control circuit.

16. The apparatus of claim 12, wherein:
the control circuit is configured to perform the periodic issuing of the read refresh command according to a time period which is a function of a sensed temperature.

17. An apparatus, comprising:
a plurality of memory cells within an array, the array comprising word lines, each memory cell connected to a word line;
a maintenance circuit, to perform a conditioning operation on one or more word lines of the array, configured to increase voltages of the one or more word lines to an elevated level, followed by a decrease of the voltages of the one or more word lines to a final level; and
a timer configured to track a duration since a last sensing operation in the array, wherein the maintenance circuit is configured to maintain the voltages at the elevated level for a duration which is based on the duration since the last sensing operation.

18. The apparatus of claim 17, wherein:
the plurality of memory cells are arranged in a NAND string, the NAND string comprising a floating body channel, the array comprising word lines, each memory cell of the plurality of memory cells connected to a respective word line of the word lines; and
the maintenance circuit is configured to perform the conditioning operation concurrently on the word lines.

19. An apparatus, comprising:
a plurality of memory cells within an array, the array comprising word lines, each memory cell connected to a word line; and
a maintenance circuit, to perform a conditioning operation on one or more word lines of the array, configured to increase voltages of the one or more word lines to an elevated level, followed by a decrease of the voltages of the one or more word lines to a final level, wherein:
   the maintenance circuit performs the conditioning operation on the one or more word lines in response to a determination that a read command involving the array is issued; and
   the maintenance circuit is configured to execute the read command after performing the conditioning operation on the one or more word lines.

20. The apparatus of claim 19, wherein:
the plurality of memory cells are arranged in a NAND string, the NAND string comprising a floating body channel, the array comprising word lines, each memory cell of the plurality of memory cells connected to a respective word line of the word lines; and
the maintenance circuit is configured to perform the conditioning operation concurrently on the word lines.

* * * * *